(12) United States Patent
Kurjanowicz et al.

(10) Patent No.: US 8,026,574 B2
(45) Date of Patent: Sep. 27, 2011

(54) ANTI-FUSE MEMORY CELL

(75) Inventors: Wlodek Kurjanowicz, Amprior (CA); Steven Smith, Wakefield (CA)

(73) Assignee: Sidense Corporation, Ottawa, Ontario (CA)

( * ) Notice: Subject to any disclaimer, the term of this patent is extended or adjusted under 35 U.S.C. 154(b) by 0 days.

(21) Appl. No.: 12/814,124

(22) Filed: Jun. 11, 2010

(65) Prior Publication Data
US 2010/0244115 A1    Sep. 30, 2010

Related U.S. Application Data

(63) Continuation of application No. 11/762,552, filed on Jun. 13, 2007, now Pat. No. 7,755,162, which is a continuation-in-part of application No. 10/553,873, filed as application No. PCT/CA2005/000701 on May 6, 2005, now Pat. No. 7,402,855.

(60) Provisional application No. 60/568,315, filed on May 6, 2004.

(51) Int. Cl.
    *H01L 29/00*    (2006.01)
(52) U.S. Cl. ..... 257/530; 257/50; 257/288; 257/E23.147
(58) Field of Classification Search ............... 257/50, 257/188, 288, 528, 529, 530, E23.147
See application file for complete search history.

(56) References Cited

U.S. PATENT DOCUMENTS

| | | | |
|---|---|---|---|
| 3,423,646 A | 1/1969 | Cooper et al. | |
| 3,576,549 A | 4/1971 | Hess et al. | |
| 3,634,929 A | 1/1972 | Yoshida et al. | |
| 3,719,866 A | 3/1973 | Naber et al. | |
| 3,781,977 A | 1/1974 | Hulmes | |
| 3,877,055 A | 4/1975 | Fisher et al. | |
| 4,322,822 A | 3/1982 | McPherson | |
| 4,488,262 A | 12/1984 | Basire | |
| 4,490,900 A | 1/1985 | Chiu | |
| 4,495,693 A | 1/1985 | Iwahashi | |
| 4,502,208 A | 3/1985 | McPherson | |
| 4,507,757 A | 3/1985 | McElroy | |
| 4,543,594 A | 9/1985 | Mohsen et al. | |
| 4,546,273 A | 10/1985 | Osman | |
| 4,599,705 A | 7/1986 | Holmberg | |

(Continued)

FOREIGN PATENT DOCUMENTS

EP    0089457 A1    9/1983
(Continued)

OTHER PUBLICATIONS

European Patent Application No. 08772785.5 Search Report dated Dec. 7, 2010.
(Continued)

*Primary Examiner* — Hoai V Pham
(74) *Attorney, Agent, or Firm* — Shin Hung; Borden Ladner Gervais LLP

(57) ABSTRACT

An anti-fuse memory cell having a variable thickness gate oxide. The variable thickness gate oxide has a thick gate oxide portion and a thin gate oxide portion, where the thing gate oxide portion has at least one dimension less than a minimum feature size of a process technology. The thin gate oxide can be rectangular in shape or triangular in shape. The anti-fuse transistor can be used in a two-transistor memory cell having an access transistor with a gate oxide substantially identical in thickness to the thick gate oxide of the variable thickness gate oxide of the anti-fuse transistor.

5 Claims, 15 Drawing Sheets

U.S. PATENT DOCUMENTS

| | | | |
|---|---|---|---|
| 4,611,308 A | 9/1986 | Lonky | |
| 4,613,886 A | 9/1986 | Chwang | |
| 4,677,742 A | 7/1987 | Johnson | |
| 4,720,818 A | 1/1988 | Takeguchi | |
| 4,758,745 A | 7/1988 | Elgamal | |
| 4,758,986 A | 7/1988 | Kuo | |
| 4,794,562 A | 12/1988 | Kato | |
| 4,823,181 A | 4/1989 | Mohsen et al. | |
| 4,870,302 A | 9/1989 | Freeman | |
| 4,876,220 A | 10/1989 | Mohsen | |
| 4,881,114 A | 11/1989 | Mohsen | |
| 4,899,205 A | 2/1990 | Hamdy et al. | |
| 4,943,538 A | 7/1990 | Mohsen | |
| 4,962,342 A | 10/1990 | Mead | |
| 5,008,721 A | 4/1991 | Gill et al. | |
| 5,019,878 A | 5/1991 | Yang | |
| 5,029,130 A | 7/1991 | Yeh | |
| 5,057,451 A | 10/1991 | McCollum | |
| 5,068,696 A | 11/1991 | Yang et al. | |
| 5,087,958 A | 2/1992 | Chen | |
| 5,110,754 A | 5/1992 | Lowrey | |
| 5,138,410 A | 8/1992 | Takebuchi | |
| 5,138,423 A | 8/1992 | Matsuo | |
| 5,150,179 A | 9/1992 | Gill | |
| 5,163,180 A | 11/1992 | Eltoukhy et al. | |
| 5,241,496 A | 8/1993 | Lowrey et al. | |
| 5,254,489 A | 10/1993 | Nakata | |
| 5,258,947 A | 11/1993 | Sourgen | |
| 5,303,185 A | 4/1994 | Hazani | |
| 5,304,871 A | 4/1994 | Dharmarajan | |
| 5,323,342 A | 6/1994 | Wada | |
| 5,323,351 A | 6/1994 | Challa | |
| 5,330,920 A | 7/1994 | Soleimani et al. | |
| 5,331,181 A | 7/1994 | Tanaka | |
| 5,396,465 A | 3/1995 | Oh | |
| 5,401,993 A | 3/1995 | Yamauchi | |
| 5,412,244 A | 5/1995 | Hamdy | |
| 5,416,343 A | 5/1995 | Slotboom et al. | |
| 5,422,505 A | 6/1995 | Shirai | |
| 5,442,589 A | 8/1995 | Kowalski | |
| 5,455,525 A | 10/1995 | Ho | |
| 5,477,499 A | 12/1995 | Van Buskirk | |
| 5,496,756 A | 3/1996 | Sharma | |
| 5,502,326 A | 3/1996 | Slotboom | |
| 5,550,773 A | 8/1996 | Woerlee | |
| 5,561,315 A | 10/1996 | Van Dort | |
| 5,576,568 A | 11/1996 | Kowshik | |
| 5,578,848 A | 11/1996 | Kwong | |
| 5,586,270 A | 12/1996 | Rotier | |
| 5,587,603 A | 12/1996 | Kowshik | |
| 5,595,922 A | 1/1997 | Tigelaar et al. | |
| 5,600,265 A | 2/1997 | El Gamal | |
| 5,646,438 A | 7/1997 | Frerichs | |
| 5,650,336 A | 7/1997 | Eriguchi | |
| 5,672,994 A | 9/1997 | Au et al. | |
| 5,675,541 A | 10/1997 | Leterrier | |
| 5,675,547 A | 10/1997 | Koga | |
| 5,741,737 A | 4/1998 | Kachelmeier | |
| 5,742,555 A | 4/1998 | Marr et al. | |
| 5,745,417 A | 4/1998 | Kobayashi | |
| 5,781,032 A | 7/1998 | Bertolet | |
| 5,784,636 A | 7/1998 | Rupp | |
| 5,786,268 A | 7/1998 | Gordon et al. | |
| 5,798,552 A | 8/1998 | Alavi | |
| 5,801,991 A | 9/1998 | Keeney et al. | |
| 5,821,766 A | 10/1998 | Kim et al. | |
| 5,825,069 A | 10/1998 | Wen et al. | |
| 5,825,200 A | 10/1998 | Kolze | |
| 5,825,201 A | 10/1998 | Kolze | |
| 5,847,441 A | 12/1998 | Cutter | |
| 5,880,512 A | 3/1999 | Gordon | |
| 5,882,993 A | 3/1999 | Gardner et al. | |
| 5,889,411 A | 3/1999 | Chaudhary | |
| 5,892,962 A | 4/1999 | Cloutier | |
| 5,899,732 A | 5/1999 | Gardner et al. | |
| 5,909,049 A | 6/1999 | McCollum | |
| 5,918,133 A | 6/1999 | Gardner et al. | |
| 5,925,904 A | 7/1999 | Schmidt et al. | |
| 5,929,482 A | 7/1999 | Kawakami | |
| 5,949,712 A | 9/1999 | Rao | |
| 5,963,799 A | 10/1999 | Wu | |
| 5,986,931 A | 11/1999 | Caywood | |
| 5,986,939 A | 11/1999 | Yamada | |
| 5,999,450 A | 12/1999 | Dallabora | |
| 6,016,268 A | 1/2000 | Worley | |
| 6,031,761 A | 2/2000 | Ghilardelli | |
| 6,034,893 A | 3/2000 | Mehta | |
| 6,037,224 A | 3/2000 | Buller et al. | |
| 6,040,968 A | 3/2000 | Duvvury | |
| 6,047,243 A | 4/2000 | Bang | |
| 6,064,225 A | 5/2000 | Andrews | |
| 6,064,595 A | 5/2000 | Logie | |
| 6,077,719 A | 6/2000 | Koike | |
| 6,080,682 A | 6/2000 | Ibok | |
| 6,084,428 A | 7/2000 | Kolze | |
| 6,087,707 A | 7/2000 | Lee et al. | |
| 6,096,580 A | 8/2000 | Iyer et al. | |
| 6,097,077 A | 8/2000 | Gordon | |
| 6,110,783 A | 8/2000 | Burr | |
| 6,115,283 A | 9/2000 | Hidaka | |
| 6,121,666 A | 9/2000 | Burr | |
| 6,121,795 A | 9/2000 | Curd | |
| 6,124,171 A | 9/2000 | Arghavani et al. | |
| 6,127,235 A | 10/2000 | Gardner et al. | |
| 6,134,144 A | 10/2000 | Lin | |
| 6,136,674 A | 10/2000 | An et al. | |
| 6,153,463 A | 11/2000 | Wei | |
| 6,157,568 A | 12/2000 | Schmidt | |
| 6,166,954 A | 12/2000 | Chern | |
| 6,198,652 B1 | 3/2001 | Kawakubo | |
| 6,214,666 B1 | 4/2001 | Mehta | |
| 6,215,140 B1 | 4/2001 | Reisinger | |
| 6,218,274 B1 | 4/2001 | Komatsu | |
| 6,221,731 B1 | 4/2001 | Peng et al. | |
| 6,229,733 B1 | 5/2001 | Male | |
| 6,232,631 B1 | 5/2001 | Schmidt | |
| 6,236,229 B1 | 5/2001 | Or-Bach | |
| 6,249,809 B1 | 6/2001 | Bro | |
| 6,266,269 B1 | 7/2001 | Karp | |
| 6,282,123 B1 | 8/2001 | Mehta | |
| 6,294,809 B1 | 9/2001 | Logie | |
| 6,295,226 B1 | 9/2001 | Yang | |
| 6,297,103 B1 | 10/2001 | Ahn | |
| 6,304,666 B1 | 10/2001 | Warren | |
| 6,335,262 B1 | 1/2002 | Crowder et al. | |
| 6,337,250 B2 | 1/2002 | Furuhata | |
| 6,351,428 B2 | 2/2002 | Forbes | |
| 6,369,422 B1 | 4/2002 | Lojek | |
| 6,396,120 B1 | 5/2002 | Bertin et al. | |
| 6,400,632 B1 | 6/2002 | Tanizaki et al. | |
| 6,420,925 B1 | 7/2002 | Fifield et al. | |
| 6,421,293 B1 | 7/2002 | Candelier | |
| 6,429,686 B1 | 8/2002 | Nguyen | |
| 6,431,456 B2 | 8/2002 | Nishizawa | |
| 6,445,619 B1 | 9/2002 | Mihnea | |
| 6,456,535 B2 | 9/2002 | Forbes | |
| 6,459,634 B1 | 10/2002 | Sher | |
| 6,476,636 B1 | 11/2002 | Lien | |
| 6,515,344 B1 | 2/2003 | Wollesen | |
| 6,515,509 B1 | 2/2003 | Baxter | |
| 6,531,410 B2 | 3/2003 | Bertin et al. | |
| 6,545,899 B1 | 4/2003 | Derner et al. | |
| 6,556,481 B1 | 4/2003 | Hsu | |
| 6,569,101 B2 | 5/2003 | Quistgaard | |
| 6,580,145 B2 | 6/2003 | Wu et al. | |
| 6,597,234 B2 | 7/2003 | Reber et al. | |
| 6,602,729 B2 | 8/2003 | Lin | |
| 6,611,040 B2 | 8/2003 | Gelsomini et al. | |
| 6,627,970 B2 | 9/2003 | Fuller et al. | |
| 6,630,724 B1 | 10/2003 | Marr | |
| 6,633,182 B2 | 10/2003 | Pileggi | |
| 6,650,143 B1 | 11/2003 | Peng | |
| 6,667,902 B2 | 12/2003 | Peng | |
| 6,671,040 B2 | 12/2003 | Fong et al. | |
| 6,674,670 B2 | 1/2004 | Jeung | |
| 6,678,646 B1 | 1/2004 | McConnell | |
| 6,682,980 B2 | 1/2004 | Chidambaram | |

| | | | |
|---|---|---|---|
| 6,697,902 B1 | 2/2004 | Sugimoto | |
| 6,700,151 B2 | 3/2004 | Peng | |
| 6,700,176 B2 | 3/2004 | Ito et al. | |
| 6,713,839 B2 | 3/2004 | Madurawe | |
| 6,714,450 B2 | 3/2004 | Bertrand | |
| 6,753,590 B2 | 6/2004 | Fifield et al. | |
| 6,754,881 B2 | 6/2004 | Kuhlmann | |
| 6,756,633 B2 | 6/2004 | Wang et al. | |
| 6,777,757 B2 | 8/2004 | Peng | |
| 6,808,985 B1* | 10/2004 | Lee et al. | 438/257 |
| 6,812,122 B2 | 11/2004 | Bertin et al. | |
| 6,813,406 B2 | 11/2004 | Hatam-Tabrizi | |
| 6,829,169 B2 | 12/2004 | Ganivet | |
| 6,856,540 B2 | 2/2005 | Peng | |
| 6,862,205 B2 | 3/2005 | Agata | |
| 6,898,116 B2 | 5/2005 | Peng | |
| 6,903,984 B1 | 6/2005 | Tang | |
| 6,933,557 B2 | 8/2005 | Lojek | |
| 6,936,909 B2 | 8/2005 | Marr et al. | |
| 6,940,751 B2 | 9/2005 | Peng et al. | |
| 6,992,365 B2 | 1/2006 | Xu et al. | |
| 7,030,458 B2 | 4/2006 | Marr et al. | |
| 7,087,499 B2 | 8/2006 | Rankin et al. | |
| 7,101,738 B2 | 9/2006 | Marr et al. | |
| 7,126,871 B2 | 10/2006 | Marr et al. | |
| 2001/0003374 A1 | 6/2001 | Bohmer | |
| 2001/0026494 A1 | 10/2001 | Marr | |
| 2002/0027822 A1 | 3/2002 | Candelier et al. | |
| 2002/0051399 A1 | 5/2002 | Tanizaki et al. | |
| 2002/0074616 A1 | 6/2002 | Chen et al. | |
| 2002/0185694 A1 | 12/2002 | Ooishi et al. | |
| 2002/0192910 A1 | 12/2002 | Ramsbey | |
| 2003/0052320 A1 | 3/2003 | Tran | |
| 2003/0071315 A1 | 4/2003 | Peng | |
| 2003/0094608 A1 | 5/2003 | Abadeer | |
| 2003/0098495 A1 | 5/2003 | Amo et al. | |
| 2003/0109090 A1 | 6/2003 | Bertin et al. | |
| 2003/0202376 A1 | 10/2003 | Peng et al. | |
| 2003/0206467 A1 | 11/2003 | Peng et al. | |
| 2003/0207526 A1 | 11/2003 | Gelsomini et al. | |
| 2003/0218234 A1 | 11/2003 | Madurawe | |
| 2003/0218920 A1 | 11/2003 | Harari | |
| 2004/0004269 A1 | 1/2004 | Fifield et al. | |
| 2004/0023440 A1 | 2/2004 | Ito et al. | |
| 2004/0065941 A1 | 4/2004 | Marr | |
| 2004/0076070 A1 | 4/2004 | Kim | |
| 2004/0135198 A1 | 7/2004 | Murahama | |
| 2004/0156234 A1 | 8/2004 | Peng et al. | |
| 2006/0244099 A1 | 11/2006 | Kurjanowicz | |
| 2006/0292755 A1 | 12/2006 | Parris et al. | |

FOREIGN PATENT DOCUMENTS

| | | |
|---|---|---|
| EP | 0295935 | 12/1988 |
| JP | 61292295 | 12/1986 |
| JP | 1015966 | 1/1989 |
| JP | 4-44273 | 2/1992 |
| JP | 6132501 | 5/1994 |
| JP | 08-213483 | 8/1996 |
| JP | 2000-077627 | 3/2000 |
| KR | 20010030493 | 4/2001 |
| WO | 03025944 A1 | 3/2003 |
| WO | 2004003966 | 1/2004 |
| WO | 2005109516 A1 | 11/2005 |

OTHER PUBLICATIONS

European Patent Application No. 05743122.3 Supplementary European Search Report dated Jul. 2, 2009.
International Patent Application No. PCT/CA2008/001122, Search Report dated Sep. 18, 2008.
U.S. Appl. No. 10/553,873 Office Action dated May 14, 2008.
U.S. Appl. No. 11/762,552 Notice of Allowance dated Apr. 28, 2010.
U.S. Appl. No. 11/877,299 Notice of Allowance dated Oct. 14, 2009.
European Patent Application No. 05743122.3, Office Action dated Jun. 23, 2010.
Alam et al. "A Study of Soft and Hard Breakdown—Part I: Analysis of Statistical Percolation Conductance," IEEE Transactions on Electron Devices, 49:232-238 (Feb. 2002).
Alam et al. "A Study of Soft and Hard Breakdown—Part II: Principles of Area, Thickness, and Voltage Scaling," IEEE Transactions on Electron Devices, 49:239-246 (Feb. 2002).
Crupi et al. "A Novel Methodology for Sensing the Breakdown Location and Its Application to the Reliability Study of Ultrathin Hf-Silicate Gate Dielectrics," IEEE Transactions on Electron Devices 52:1759-1768 (Aug. 2005).
Degraeve et al. "A Consistent Model for the Thickness Dependence of Intrinsic Breakdown in Ultra-Thin Oxides," IEEE International Electron Devices Meeting, pp. 863-866 (1995).
Degraeve et al. "Relation Between Breakdown Mode and Location in Short-Channel nMOSFETs and Its Impact on Reliability Specifications," IEEE Transactions on Device and Materials Reliability 1:163-169 (Sep. 2001).
Esquivel "High Density Contactless, Self Aligned EPROM Cell Array Technology," IEEE International Electron Devices Meeting, pp. 592-595 (1986).
Ghani et al., 100nm Gate Length High Performance / Low Power CMOS Transistor Structure, IEEE International Electron Devices Meeting, pp. 415-418 (1999).
Gill et al. "A 5-Volt Contactless Array 256Kbit Flash EEPROM Technology," IEEE International Electron Devices Meeting, pp. 428-431 (1988).
Kaczer et al. "Consistent Model for Short-Channel nMOSFET After Hard Gate Oxide Breakdown," IEEE Transactions on Electron Devices 49:507-513 (Mar. 2002).
Ko et al. "The Effects of Weak Gate-to-Drain(Source) Overlap on MOSFET Characteristics," IEEE International Electron Devices Meeting, pp. 292-295 (1986).
Lee "A Capacitance-Based Method for Experimental Determination of Metallurgical Channel Length of Submicron LDD MOSFET's," IEEE Transactions on Electron Devices 41:403-4112 (Mar. 1994).
Ogura et al. "A Half Micron MOSFET Using Double Implanted LDD," IEEE International Electron Devices Meeting pp. 718-721 (1982).
Shur "Split-Gate Field Effect Transistor," Applied Physics Letters 54:162-164 (Jan. 1989).
Weir, B.E., et al., Ultra-Thin Gate Dielectrics: They Break Down, But Do They Fail?, IEEE International Electron Devices Meeting, pp. 73-76 (1997).
Wong "Sidewall Oxidation of Polycrystalline-Silicon Gate," IEEE Electron Device Letters 10:420-422 (Sep. 1989).
Wu et al. "Structural Dependence of Dielectric Breakdown in Ultra-Thin Oxides and Its Relationship to Soft Breakdown Modes and Device Failure;" IEEE International Electron Devices Meeting pp. 187-1990 (1998).
Yang et al. "Asymmetric Gate (AG) FET: Sub-micron MOS Device Structure With Excellent performance," Proceedings, 6th Intern. Conf. on Solid State and Integrated Circuits Technology pp. 543-546 (2001).
Kim et al., "3-Transistor Cell OTP ROM Array Using Standard CMOS ate-Oxide Antifuse", Journal of Semiconductor Technology and Science, vol. 3, No. 4, Dec. 2003, 6 pages.
Wu, E.W. et al; Voltage-Dependent Voltage-Acceleration of Oxide Breakdown for Ultra-Thin Oxides; IEEE, 2000.
Sune, Jordi et al; Post Soft Breakdown Conduction in SiO2 Gate Oxides; IEEE, 2000.
DeGraaf, C., et al. A Novel High-Density Low-Cost Diode Programmable Read Only Memory, IEEE, 1996.
Rasras, Mahmoud et al; Substrate Hole Current Origin After Oxide Breakdown; IEEE, 2000.
Lombardo, S. et al; Softening of Breakdown in Ultra-Thin Gate Oxide nMOSFET's at Low Inversion Layer Density; 39th Annual International Reliability Physics Symposium; Orlando, FL 2001.
Miranda, Enrique et al; Analytic Modeling of Leakage Current Through Multiple Breakdown Paths in SiO2 Films; 39th Annual International Reliabiligy Physics Symposium; Orlando, FL 2001.
English Abstract of Japanese Application JP-A-2002-093745, published Mar. 29, 2002, Matsushita Electric Ind. Co. Ltd.
English Abstract of Japanese Application JP-A08-213483, published Aug. 29, 1996, Deutscheitt Ind. GmbH.

English Abstract of Japanese Application JP-A-08-172138, published Jul. 2, 1996, Advanced Micro Devices Inc.
English Abstract of Japanese Application JP-A-2002-319674, published Oct. 31, 2002, International Business Machine Corp.
English Abstract of Japanese Application JP-A-03-220767, published Sep. 27, 1991, Sharp Corp.
Japanese Patent Application No. 2007-511808, English Translation of Office Action dated May 20, 2011.
English Translation of Korean Patent Application No. 2006-7025621 Office Action dated May 18, 2011.

* cited by examiner

ANTI-FUSE MEMORY CELL

CROSS REFERENCE TO RELATED APPLICATIONS

This application is a continuation of U.S. patent application Ser. No. 11/762,552 filed on Jun. 13, 2007, which is a continuation in part of U.S. patent application Ser. No. 10/553,873 filed on Oct. 21, 2005, now U.S. Pat. No. 7,402,855 issued Jul. 22, 2008, which is a national stage entry of PCT Serial No. CA2005/000701 filed on May 6, 2005, which claims priority to U.S. Provisional Patent Application No. 60/568,315 filed on May 6, 2004, which is incorporated herein by reference in its entirety.

FIELD OF THE INVENTION

The present invention relates generally to non-volatile memory. More specifically, the invention is directed to anti-fuse memory cell structures.

BACKGROUND OF THE INVENTION

Over the past 30 years, anti-fuse technology has attracted significant attention of many inventors, IC designers and manufacturers. An anti-fuse is a structure alterable to a conductive state, or in other words, an electronic device that changes state from not conducting to conducting. Equivalently, the binary states can be either one of high resistance and low resistance in response to electric stress, such as a programming voltage or current. There have been many attempts to develop and apply anti-fuses in microelectronic industry, but the most successful anti-fuse applications to date can be seen in FGPA devices manufactured by Actel and Quicklogic, and redundancy or option programming used in DRAM devices by Micron.

A summary of the progression of anti-fuse development follows as evidenced by issued United States patents.

Anti-fuse technology development started with U.S. Pat. No. 3,423,646, which disclosed a thin film formable diode PROM built as an array of horizontal and vertical conductors with a thin dielectric (aluminium oxide) between the conductors, at their crossings. Such NVM memory was programmed through perforation of the dielectric in some of the crossings. A formable diode would act as an open circuit until a voltage of sufficient magnitude and duration is applied to the crossing to cause forming of the aluminum oxide intermediate layer at which time device would act as a tunneling diode.

U.S. Pat. No. 3,634,929 disclosed an inter-metal semiconductor anti-fuse array, the structure of the anti-fuse consisting of a thin dielectric capacitor (AlO2, SiO2 or Si3N4) utilizing two (Al) conductors located above and connected to the semiconductor diode.

A programmable dielectric ROM memory structure using a MOS capacitor and a MOS switching element was shown in U.S. Pat. No. 4,322,822 (McPherson). This cell was formed as a standard gate-oxide-over-substrate capacitor having a gate connected to a MOS transistor using a buried contact. In order to lower the oxide breakdown voltage, which needed to be smaller for the anti-fuse capacitor then for the MOS switch, a V-shaped grove in the capacitor area was proposed. Since the capacitor was formed between the poly gate and the grounded p-type substrate, the rupture voltage had to be applied to the capacitor through an access transistor. The Gate/Drain and Gate/Source edges of the access transistors were located at the second field oxide, much thicker then the gate oxide in the channel area, which greatly improved Gate/S-D breakdown voltage.

U.S. Pat. No. 4,507,757 (McElroy) proposed a method for lowering gate oxide breakdown voltage through avalanche junction breakdown. Although the original McElroy ideas evolved around using gated diodes to locally induce avalanche breakdown, which in turn lowered dielectric rupture voltage by enhanced electron tunneling, he actually introduced or embodied other and perhaps more important elements to anti-fuse technology: (a) Dual gate oxide anti-fuse: access transistor gate oxide thicker then anti-fuse dielectric. McElroy's dual gate oxide process steps are: initial gate oxidation, etching areas for thinner gate oxide and subsequent gate oxidation. This procedure is now used in standard CMOS technologies for "I/O" and "1T" devices. (b) A "common-gate" (planar DRAM like) anti-fuse connection where access transistor connects to anti-fuse diffusion (Drain) node and all the anti-fuse gates are connected together. This is opposite to McPherson arrangement and results in much denser cell since the buried contact is eliminated. (c) Limiting resistor between common anti-fuse gate and external ground. (d) Two-terminal anti-fuse MOS device (a half transistor): McElroy concluded that only two terminals are needed in anti-fuse capacitor: D and G. The Source is not really needed for anti-fuse programming or operation and can be fully isolated from the active area. The bulk connection does not play any role either except for the avalanche breakdown. So the source role is limited to collecting carriers from the avalanche breakdown should the local substrate potential increase to forward bias the emitter of a parasitic n-p-n device formed by D, B and S.

It wasn't until 1985 when U.S. Pat. No. 4,543,594 (Mohsen) proposed an anti-fuse design suitable for redundancy repair. As such application requires much lower density than PROM, it was easier to supply external high voltage necessary to rupture the oxide without actually passing this voltage through the access transistors. Mohsen's anti-fuse structure consisted of a thin oxide (50-150 A SiO2) polysilicon capacitor over a doped region. He believed that silicon from the substrate or silicon from the electrode where a polysilicon electrode is used melts into pin holes in the insulative layer to provide the conductor, and his test data showed that where the oxide layer is approximately 100 A thick and has an area between 10 to 500 um2, fusion occurred at a voltage of 12 to 16 volts. The current required to cause this fusion is less than 0.1 uA/um2 of capacitor area, and the resulting fused link has a resistance of approximately 0.5 to 2K ohms. A link, once fused, can handle currents of up to 100 milliamps at room temperature for approximately one second before it heals to an open fuse. Taking into account electron migration wear-out, the predicted wear-out lifetime of a link, once fused, is substantially greater than 3E8 hours.

The possibility of anti-fuse self-healing under current stress appeared to be the main roadblock for application of this technology in such areas like PROMs, PLDs and FPGAs, where constant fuse stress was required. The anti-fuse healing problem was resolved later by Mohsen and others at Actel in U.S. Pat. No. 4,823,181. Actel teaches the way to implement a reliable programmable low impedance anti-fuse element by using an ONO structure instead of silicon dioxide. Actel's method required an ohmic contact after dielectric rupture. This was achieved either by using heavily doped diffusion, or by putting an ONO dielectric between two metal electrodes (or silicide layers). The necessity of an Arsenic doped bottom diffusion electrode was revised later in U.S. Pat. No. 4,899,205, where it was allowed for either top-poly or bottom-diffusion to be highly doped.

U.S. Pat. No. 5,019,878 taught that if the drain is silicided, the application of a programming voltage in the range of ten to fifteen volts from the drain to the source reliably forms a melt filament across the channel region. A gate voltage may be applied to control the specific transistors to melt. IBM discovered similar effect by proposing a channel anti-fuse in U.S. Pat. No. 5,672,994. They discovered that with 0.5 um technology, the BVDSS for the nmos transistor is not only in the order of 6.5V, but once the S-D punch through occurs it creates permanent damage resulting in few kilo ohms leakage between the source and the drain.

U.S. Pat. Nos. 5,241,496 and 5,110,754 to Micron, disclosed a DRAM cell based anti-fuse (trench and stack). In 1996, Micron introduced a well-to-gate capacitor as an anti-fuse in U.S. Pat. No. 5,742,555. U.S. Pat. No. 6,087,707 proposed an N-Well coupled anti-fuse as a way to eliminate undercut defects associated with polysilicon etching. U.S. Patent Application No. 2002/0027,822 proposed a similar anti-fuse structure, but with n+ regions removed to create an asymmetrical ("unbalanced") high voltage access transistor using the N-well as a drain electrode.

U.S. Pat. No. 6,515,344 proposed a range of P+/N+ anti-fuse configurations, implemented using a minimum size gate between two opposite type diffusion regions.

NMOS anti-fuses have been built in an isolated P-well using a standard Deep N-Well process. An example of Deep N-Well based anti-fuses is disclosed in U.S. Pat. No. 6,611,040.

U.S. Patent Application Nos. 2002,0074,616 and 2004,0023,440 disclose other Deep N-Well anti-fuses. These anti-fuses consisted of a capacitor featuring direct tunneling current rather then Fowler Nordheim current. These applications confirm that anti-fuse performance is generally improved for thinner gate oxide capacitors (approx 20 A, which is typical for transistors in 0.13 um process).

U.S. Pat. No. 6,580,145 disclosed a new version of a traditional anti-fuse structure utilizing dual gate oxides, with the thicker gate oxide being used for nmos (or pmos) access transistors and the thinner gate oxide for the capacitor. The N-Well (or P-Well) is used as a bottom plate of the anti-fuse capacitor.

The idea of creating a source drain short through the gate by separately breaking the S-G and D-G dielectric regions of the transistor is disclosed in U.S. Pat. No. 6,597,234.

U.S. Patent Application No. 2004,0004,269 disclosed an anti-fuse built from a MOS transistor having gate connected to the gate of a capacitor, degenerated by a thinner gate oxide and heavy doping under the channel through additional implantation (a diode). The rupture voltage is applied to a bottom plate of the capacitor.

In U.S. Pat. No. 6,667,602 (Peng) Peng attempts to improve a classic planar DRAM-like anti-fuse array by introducing "row program lines" which connect to the capacitors and run parallel to the word lines. If decoded, the row program lines can minimize exposure of access transistors to a high programming voltage, which would otherwise occur through already programmed cells. Peng and Fong further improve their array in U.S. Pat. No. 6,671,040 by adding a variable voltage controlling programming current, which allegedly controls the degree of gate oxide breakdown, allowing for multilevel or analog storage applications.

Most recently, U.S. Patent Application No. 2003/0202376 (Peng) shows a memory array using a single transistor structure. In the proposed memory cell, Peng eliminates the LDD diffusion from a regular NMOS transistor. A cross-point array structure is formed of horizontal active area (S/D) stripes crossing vertical poly gate stripes. Drain contacts are shared between neighbouring cells and connected to horizontal wordlines. Source regions are also shared and left floating. Peng assumes that if the LDD diffusion is omitted, the gate oxide breakdown location will be far enough from the drain area and a local N+ region will be created rather than D-G (drain-gate) short. If such a region was created, the programmed cells could be detected by positively biasing the gate and sensing the gate to drain current. In order to reduce the G-D or S-D (source-drain) short probability, Peng proposes increasing gate oxide thickness at the G-D and S_D edges through modification of a gate sidewall oxidation process. Peng's array requires that both source and drain regions be present in the memory cells, row wordlines coupled to transistor drain regions, and the column bitlines formed from transistor gates. Such an unusual connection must be very specific to Peng's programming and reading method, requiring a decoded high voltage (8V in 1.8V process) applied to all drain lines except for the one to be programmed. The decoded high voltage (8V) is applied to the gates of the column to be programmed, while the other gates are kept at 3.3V.

Although Peng achieves a cross-point memory architecture, his array requires CMOS process modifications (LDD elimination, thicker gate oxide at the edge) and has the following disadvantages: (a) All row decoders, column decoders and sense amplifiers must switch a wide range of voltages: 8V/3.3V/0V or 8V/1.8V/0V. (b) During a program operation, the 3.3V column drivers are effectively shorted to 8V row drivers or 0V drivers through programmed cells. This puts many limits on the array size, affects driver size and impacts reliability and effectiveness of programming. (c) Every program operation requires that all the array active areas (except for the programmed row) are biased at 8V. This leads to large N++ junction leakage current, and again limits array size. (d) The gate oxide breaking spot is assumed to be located far enough from the drain area so the punch through is not happening at 8V bias. At the same time, the transistor must operate correctly at 1.8V biasing—connecting to the channel area. This is not achievable without significant process modification. (e) Peng assumes that the gate oxide will not break on the source or drain edge if the LDD is not present. It is however known in the art that the S/D edges are the most likely locations for the oxide breakdown because of defects and electric field concentration around sharp edges.

Peng attempts to solve some of the high voltage switching problems in U.S. Patent Application No. 2003/0206467. The high blocking voltage on wordlines and bitlines is now replaced with "floating" wordlines and bitlines, and restrictions on the distance from the channel to the source and drain regions has been changed. Although floating wordlines and bitlines may ease problems with high voltage switching, they do not solve any of the above mentioned fundamental problems. Additionally they introduce severe coupling problems between the switched and the floating lines.

Today, anti-fuse developments concentrate around 3-dimentional thin film structures and special inter-metal materials. All these anti-fuse technologies require additional processing steps not available in standard CMOS process, prohibiting anti-fuse applications in typical VLSI and ASIC designs, where programmability could help overcome problems with ever shrinking device life cycles and constantly rising chip development costs. Therefore there is an apparent need in the industry for a reliable anti-fuse structures utilizing standard CMOS process.

All the prior art anti-fuse cells and arrays either require special processing steps or suffer from high voltage exposure of MOS switching elements, leading to manufacturability and reliability problems. They are also limited to low density memory applications, with the exception of Peng's single transistor cell, which in turn has very doubtful manufacturability.

It is, therefore, desirable to provide a simple and reliable, high density, anti-fuse array architecture suitable for implementation in standard CMOS technology, without any additional processing steps.

SUMMARY OF THE INVENTION

It is an object of the present invention to obviate or mitigate at least one disadvantage of the previous anti-fuse arrays by providing an anti-fuse memory cell having high reliability by minimizing a thin gate oxide area of a variable thickness gate oxide formed between a polysilicon gate and the active area of the substrate.

In a first aspect, the present invention provides an anti-fuse transistor formed on a substrate. The anti-fuse transistor includes a polysilicon gate, a diffusion region, a field oxide region, and a variable thickness gate oxide. The polysilicon gate is formed over a channel region having a channel length. The diffusion region is proximate to a first end of the channel region. The field oxide region is proximate to a second end of the channel region. The variable thickness gate oxide is formed between the polysilicon gate and the substrate. The variable thickness gate oxide has a first thick gate oxide segment, a second thick gate oxide segment and thin gate oxide portion. The first thick gate oxide segment extends from the first end of the channel region to a first predetermined distance of the channel length. The second thick gate oxide segment is adjacent the first thick gate oxide segment, and extends from the first end of the channel region to a second predetermined distance of the channel length. The first thick gate oxide segment and the second gate oxide segment are sized for covering the channel region. The thin gate oxide portion extends from the second predetermined distance to the second end of the channel region.

According to an embodiment of the present aspect, the second thick gate oxide segment includes a third gate oxide segment being triangular in shape adjacent to the first thick gate oxide segment, the second predetermined distance being defined by a diagonal edge of the third gate oxide segment. In another embodiment, the first predetermined distance is between the first end of the channel region and the second end of the channel region, and the second predetermined distance can be between the first predetermined distance and the first end of the channel region. Furthermore, the first predetermined distance can correspond to the second end of the channel region, and the second predetermined distance is between the first predetermined distance and the first end of the channel region.

In yet another embodiment of the present aspect, the channel region has a varying width between the first end and the second end of the channel region. In one embodiment, the anti-fuse transistor further includes a second diffusion region spaced from the first diffusion region to define a second channel region, a second polysilicon gate over the second channel region, and a thick gate oxide between the polysilicon gate and the second channel region, the thick gate oxide having a thickness identical to the first thick gate oxide segment. In the present embodiment, the first thick gate oxide segment includes a first sub-segment extending from the first end of the channel region to a third predetermined distance, and a second sub-segment extending from the first end of the channel to the first predetermined distance. The third predetermined distance can be between the first end of the channel region and the first predetermined distance. According to further aspects of the present embodiment, the first predetermined distance and the second predetermined distance are identical. The second thick gate oxide segment includes a third sub-segment extending from the first end of the channel region to a fourth predetermined distance, and a fourth sub-segment extending from the first end of the channel to the second predetermined distance. The fourth predetermined distance is between the first end of the channel region and the second predetermined distance. The first predetermined distance can be identical to the second predetermined distance, or the third predetermined distance and the second predetermined distance can be identical, or the second predetermined distance can be between the first predetermined distance and the fourth predetermined distance.

In a further embodiment of the present aspect, the second thick gate oxide segment includes a first sub-segment extending from the first end of the channel region to a third predetermined distance, and a second sub-segment extending from the first end of the channel to the second predetermined distance, the third predetermined distance being between the first end of the channel region and the second predetermined distance. The second sub-segment includes a third gate oxide segment being triangular in shape adjacent to the first thick gate oxide segment, the second predetermined distance being defined by a diagonal edge of the third gate oxide segment.

In yet another embodiment, the thin gate oxide portion has at least one dimension less than a minimum feature size of a process technology. In another embodiment, the anti-fuse transistor further includes a second diffusion region spaced from the first diffusion region to define a second channel region, a second polysilicon gate over the second channel region, and a thick gate oxide between the polysilicon gate and the second channel region. The thick gate oxide has a thickness identical to the first thick gate oxide segment. In the present embodiment, the second diffusion region has a variable width, the channel region has a first width corresponding to a narrow section of the second diffusion region and a second width corresponding to a wide section of the second diffusion region.

In a second aspect, the present invention provides a non-volatile memory cell formed on a substrate. The non-volatile memory cell includes an anti-fuse transistor and an access transistor. The anti-fuse transistor has a first polysilicon gate over a variable thickness gate oxide, the variable thickness gate oxide having a thick gate oxide portion and a thin gate oxide portion. The access transistor has a second polysilicon gate over a fixed thickness gate oxide, the fixed thickness gate oxide and the thick gate oxide portion being substantially identical in thickness. According to an embodiment of the present aspect, the thick gate oxide portion includes a first thick gate oxide segment, a second thick gate oxide segment, and a thin gate oxide portion. The first thick gate oxide segment extends from a first end of a channel region to a second end of the channel region, the first thick gate oxide segment having a first width less than the channel width. The second thick gate oxide segment is adjacent the first thick gate oxide segment, which extends from the first end of the channel region to a predetermined distance of the channel length. The second thick gate oxide segment has a second width substantially equal to the difference between the channel width and the first width. The thin gate oxide portion extends from the predetermined distance to the second end of the channel region. In the present embodiment, the non-volatile memory cell further includes a third gate oxide segment being triangular in shape adjacent to the first thick gate oxide segment and the second thick gate oxide segment.

In a third aspect, the present invention provides anti-fuse transistor formed on a substrate. The anti-fuse transistor has a polysilicon gate over a channel region, a diffusion region, a field oxide region, and a variable thickness gate oxide. The polysilicon gate is formed over the channel region, which has a channel length and a channel width. The diffusion region is proximate to a first end of the channel region and the field oxide region is proximate to a second end of the channel region. The variable thickness gate oxide is formed between the polysilicon gate and the substrate, and has a thick gate oxide portion and a thin gate oxide portion. The thin gate oxide portion has dimensions less than a minimum feature size of a process technology.

According to embodiments of the present aspect, the thin gate oxide portion is rectangular in shape, such that a first side and a second side of the rectangle are bound by the thick gate oxide portion and a third side and a fourth side of the rectangle are bound by the channel region. Alternately, the thin gate oxide portion is triangular in shape, such that a first side and a second side of the triangle are bound by the channel region and a diagonal side of the triangle is bound by the thick gate oxide portion.

In a fourth aspect, the present invention provides a method of forming an anti-fuse transistor having a thick gate oxide area and a thin gate oxide area underneath a polysilicon gate. The method includes a) growing an intermediate oxide in an active area of the anti-fuse transistor; b) removing the intermediate oxide from an area of the active area defined by an oxide definition mask having a grade equal to or higher than a source/drain implant definition mask; and, c) growing a thin oxide in the area defined by the oxide definition mask. In embodiments of the present aspect, the oxide definition mask has a grade corresponding to a diffusion implant mask, and the oxide definition mask includes an opening overlapping an active area corner underneath the polysilicon gate to define the area. The opening can be rectangular in shape and dimensioned to have each corner overlap active area corners corresponding to at least two different anti-fuse transistors.

In further embodiments of the present aspect, the oxide definition mask includes an opening having an edge angled relative to the polysilicon gate overlapping an active area corner underneath the polysilicon gate to define the area. The opening can include a diamond shape dimensioned to have each edge overlap active area corners corresponding to at least two different anti-fuse transistors. Alternately, the oxide definition mask can include a rectangular shape having an edge overlapping the active area underneath the polysilicon gate to define the area, the area having a width corresponding to a width of the active area.

According to embodiments of the present aspect, the step of removing can include aligning the oxide definition mask with an alignment machine using a highest accuracy tolerance, and the step of growing thin oxide can include growing the thin oxide over the intermediate oxide to form the thick gate oxide area, where the step of growing thin oxide includes growing the thin oxide over the intermediate oxide to form a gate oxide for an access transistor adjacent to the anti-fuse transistor.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 7a-7c illustrate the formation of the variable thickness gate oxide in accordance with steps of the flow chart of FIG. 6;

FIG. 9 is an enlarged planar layout of the anti-fuse transistor of FIG. 8a;

DETAILED DESCRIPTION

Generally, the present invention provides a variable thickness gate oxide anti-fuse transistor device that can be employed in a non-volatile, one-time-programmable (OTP) memory array application. The anti-fuse transistor can be fabricated with standard CMOS technology, and is configured as a standard transistor element having a source diffusion, gate oxide and a polysilicon gate. The variable gate oxide underneath the polysilicon gate consists of a thick gate oxide region and a thin gate oxide region, where the thin gate oxide region acts as a localized breakdown voltage zone. A conductive channel between the polysilicon gate and the channel region can be formed in the localized breakdown voltage zone during a programming operation. In a memory array application, a wordline read current applied to the polysilicon gate can be sensed through a bitline connected to the source diffusion, via the channel of the anti-fuse transistor. More specifically, the present invention provides an effective method for utilizing split channel MOS structures as an anti-fuse cell suitable for OTP memories.

In the following description the term MOS is used to denote any FET or MIS transistor, half-transistor or capacitor structure. In order to simplify the description of the embodiments, references to gate oxides from this point forward should be understood to include dielectric materials, oxide, or a combination of oxide and dielectric materials.

Figure 1:
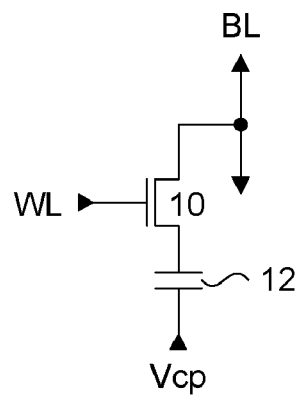
FIG. 1 is a circuit diagram of a DRAM-type anti-fuse cell.
Figure 2:
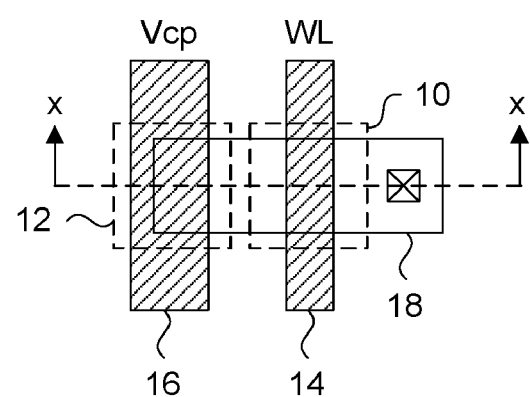
FIG. 2 is a planar layout of the DRAM-type anti-fuse cell of FIG. 1.
Figure 3:
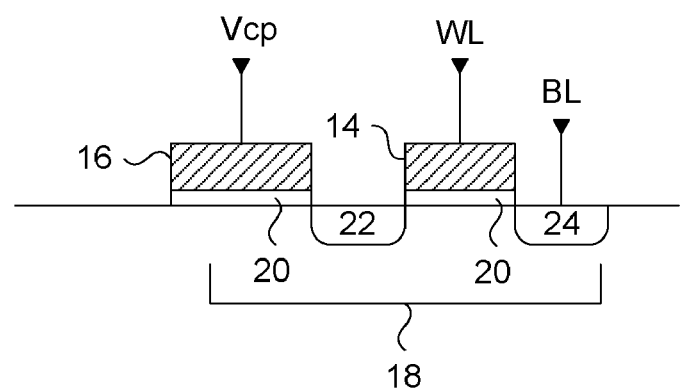
FIG. 3 is a cross-sectional view of the DRAM-type anti-fuse cell of FIG. 2 along line x-x.

As previously discussed, a DRAM-type memory array using a planar capacitors as an anti-fuse instead of as a storage capacitor is already known, as demonstrated in U.S. Pat. No. 6,667,902. FIG. 1 is a circuit diagram of such a memory cell, while FIGS. 2 and 3 show the planar and cross-sectional views respectively, of the known anti-fuse memory cell of FIG. 1. The memory cell of FIG. 1 includes a pass, or access transistor 10 for coupling a bitline BL to a bottom plate of anti-fuse device 12. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses must be reliable while simple to manufacture with a low cost CMOS process.

Figure 4:
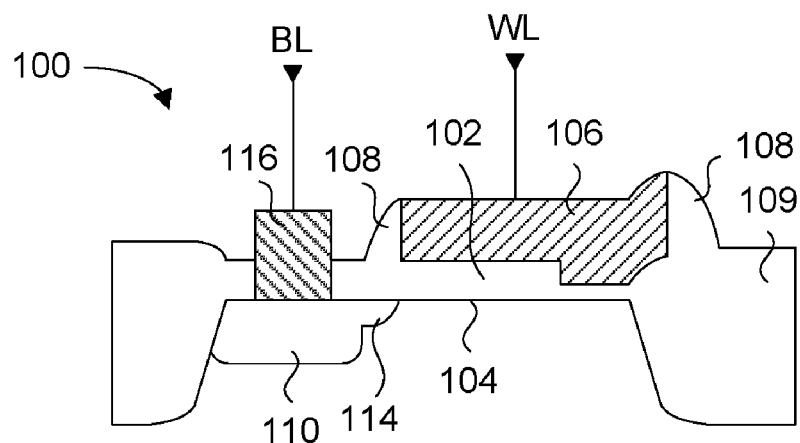
FIG. 4 is a cross-sectional view of an anti-fuse transistor according to an embodiment of the present invention.

According to an embodiment of the present invention, FIG. 4 shows a cross-sectional view of an anti-fuse transistor that can be manufactured with any standard CMOS process. In the presently shown example, the anti-fuse transistor is almost identical to a simple thick gate oxide, or input/output MOS transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4 is taken along the channel length of the device, which in the presently described embodiment is a p-channel device. Those of skill in the art will understand that the present invention can be implemented as an n-channel device.

Anti-fuse transistor 100 includes a variable thickness gate oxide 102 formed on the substrate channel region 104, a polysilicon gate 106, sidewall spacers 108, a field oxide region 109 a diffusion region 110, and an LDD region 114 in the diffusion region 110. A bitline contact 116 is shown to be in electrical contact with diffusion region 110. The variable thickness gate oxide 102 consists of a thick oxide and a thin gate oxide such that a portion of the channel length is covered by the thick gate oxide and the remaining portion of the channel length is covered by the thin gate oxide. Generally, the thin gate oxide is a region where oxide breakdown can occur. The thick gate oxide edge meeting diffusion region 110 on the other hand, defines an access edge where gate oxide breakdown is prevented and current between the gate 106 and diffusion region 110 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In a preferred embodiment, the diffusion region 110 is connected to a bitline through a bitline contact 116, or other line for sensing a current from the polysilicon gate 106, and can be doped to accommodate programming voltages or currents. This diffusion region 110 is formed proximate to the thick oxide portion of the variable thickness gate oxide 102. To further protect the edge of anti-fuse transistor 100 from high voltage damage, or current leakage, a resistor protection oxide (RPO), also known as a salicide protect oxide, can be introduced during the fabrication process to further space metal particles from the edge of sidewall spacer 108. This RPO is preferably used during the salicidiation process for preventing only a portion of diffusion region 110 and a portion of polysilicon gate 106 from being salicided.

It is well known that salicided transistors are known to have higher leakage and therefore lower breakdown voltage. Thus having a non-salicided diffusion region 110 will reduce leakage. Diffusion region 110 can be doped for low voltage transistors or high voltage transistors or a combination of the two resulting in same or different diffusion profiles.

Figure 5A:
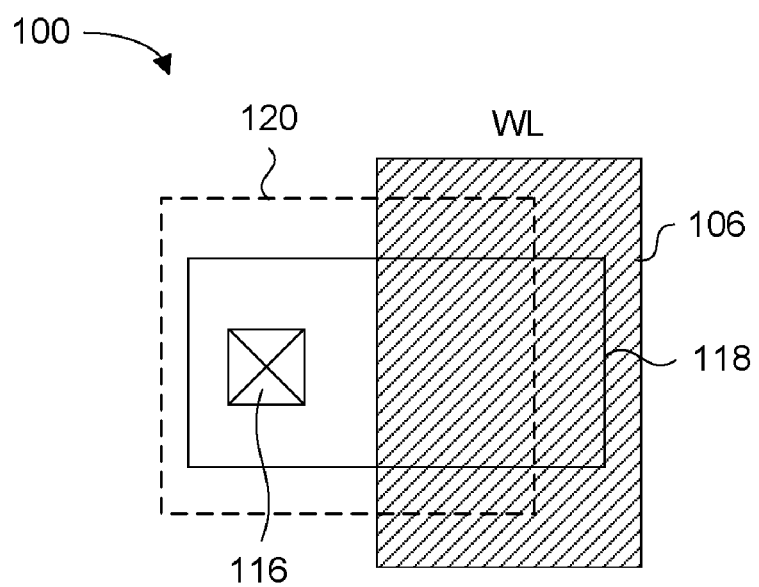
FIG. 5a is a planar layout of the anti-fuse transistor of FIG. 4.

A simplified plan view of the anti-fuse transistor 100 is shown in FIG. 5a. Bitline contact 116 can be used as a visual reference point to orient the plan view with the corresponding cross-sectional view of FIG. 4. The active area 118 is the region of the device where the channel region 104 and diffusion region 110 is formed, which is defined by an OD mask during the fabrication process. The dashed outline 120 defines the areas in which the thick gate oxide is to be formed via an OD2 mask during the fabrication process. More specifically, the area enclosed by the dashed outline 120 designates the regions where thick oxide is to be formed. OD simply refers to an oxide definition mask that is used during the CMOS process for defining the regions on the substrate where the oxide is to be formed, and OD2 refers to a second oxide definition mask different than the first. Details of the CMOS process steps for fabricating anti-fuse transistor 100 will be discussed later. According to an embodiment of the present invention, the thin gate oxide area bounded by edges of the active area 118 and the rightmost edge of the OD2 mask, is minimized. In the presently shown embodiment, this area can be minimized by shifting the rightmost OD2 mask edge towards the parallel edge of active area 118.

Figure 5B:
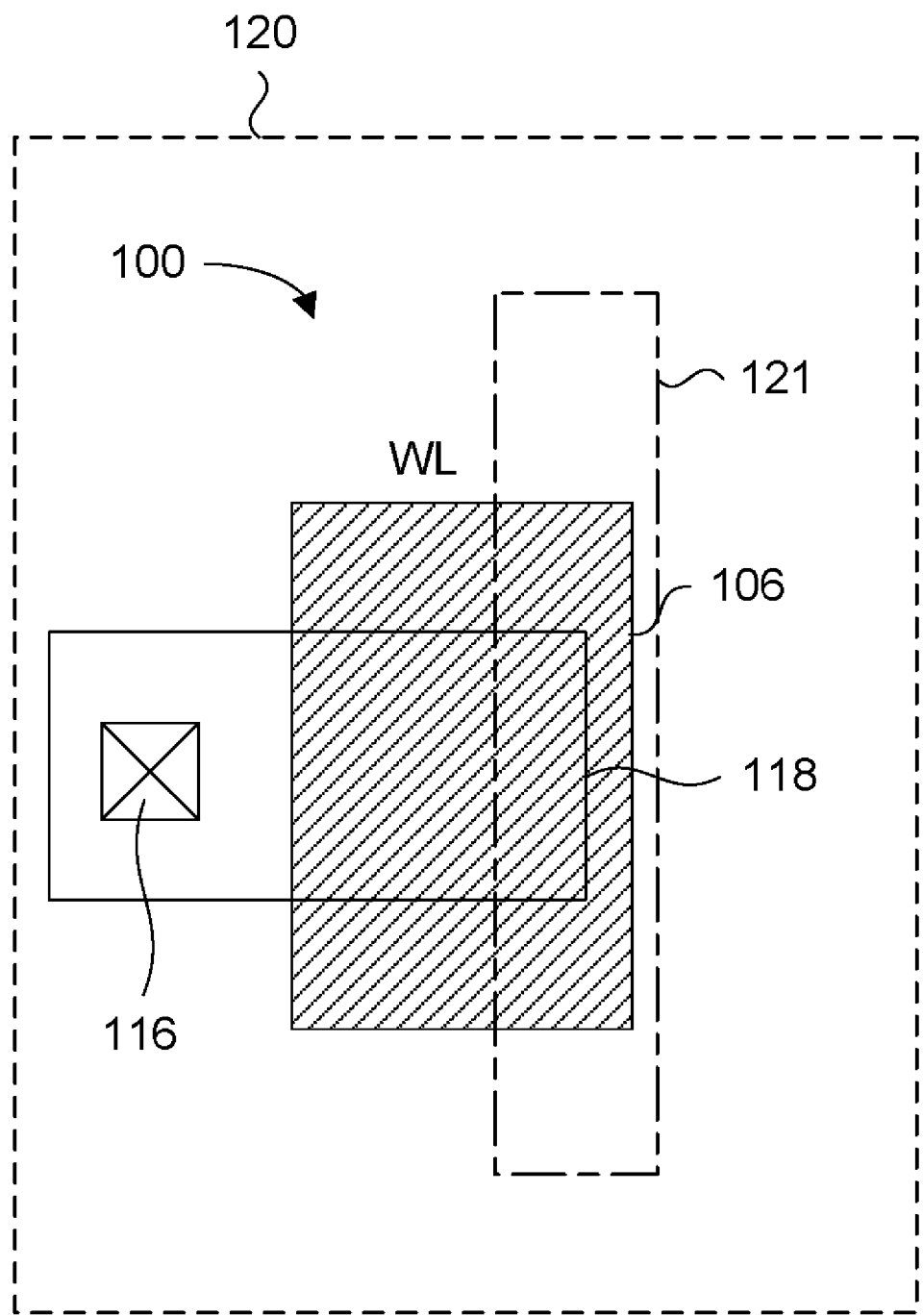
FIG. 5b is a planar layout of the anti-fuse transistor of FIG. 4 showing an alternate OD2 mask configuration.

FIG. 5b is an alternate illustration of anti-fuse 100 of FIG. 5a. In FIG. 5a, the OD2 mask 120 is shown as a large area that may extend to cover the entire memory array. As previously discussed, OD2 mask 120 defines the areas in which the thick gate oxide is to be formed. Formed within OD2 mask 120 are openings 121 defining areas where no thick gate oxide is to be formed. Instead, thin gate oxide will be grown in the area defined by openings 121. Those skilled in the art will understand that in a memory array configuration where a plurality of anti-fuse memory cells 100 are arranged in a row, one rectangular opening can overlap all the memory cells to define the thin gate oxide area for each active area 118.

Programming of anti-fuse transistor 100 is based on gate oxide breakdown to form a permanent link between the gate and the channel underneath. Gate oxide breakdown conditions (voltage or current and time) depend primarily on i) gate dielectric thickness and composition, ii) defect density, and iii) gate area, gate/diffusion perimeter. The combined thick and thin gate oxide of anti-fuse transistor 100 results in a locally lowered gate breakdown voltage, in particular an oxide breakdown zone, in the thin gate oxide portion of the device. In otherwords, the disclosed structure assures that the oxide breakdown is limited to the thinner gate oxide portion.

Additionally, the anti-fuse transistor embodiments of the present invention take advantage of a typically prohibited CMOS fabrication design rule for gate oxide design layout and formation to enhance gate oxide breakdown performance. All gate oxide processing steps in today's CMOS processes assume and are optimized for uniform gate oxide thickness within the active gate area. By introducing the variable thickness gate oxide devices into the standard CMOS flow, additional defects and electrical field disturbances are created at the boundary between the thick and thin gate oxides. Those defects may include, but are not limited to: oxide thinning, plasma etching of silicon at the boundary, residues from cleaning process and silicon recess due to different thermal oxidation rates between unmasked and partially masked regions. All these effects increase trap and defect density at the thin oxide boundary, leading to increased leakage and locally lowered breakdown voltage. Therefore, a low voltage, compact anti-fuse structure can be created without any process modification.

In a typical CMOS process, the diffusion regions, LDD and channel implantation are different for thin gate oxide transistors and thick gate oxide transistors. According to an embodiment of the present invention, the diffusion regions, LDD and the thin gate oxide channel implantation of the anti-fuse transistors can be either type; the low voltage type corresponding to the thin gate oxide, or the high voltage type corresponding to the thick gate oxide (I/O oxide), or both, provided that the resulting thin gate oxide threshold voltage is not greater in magnitude than the thick gate oxide threshold voltage.

Figure 6:
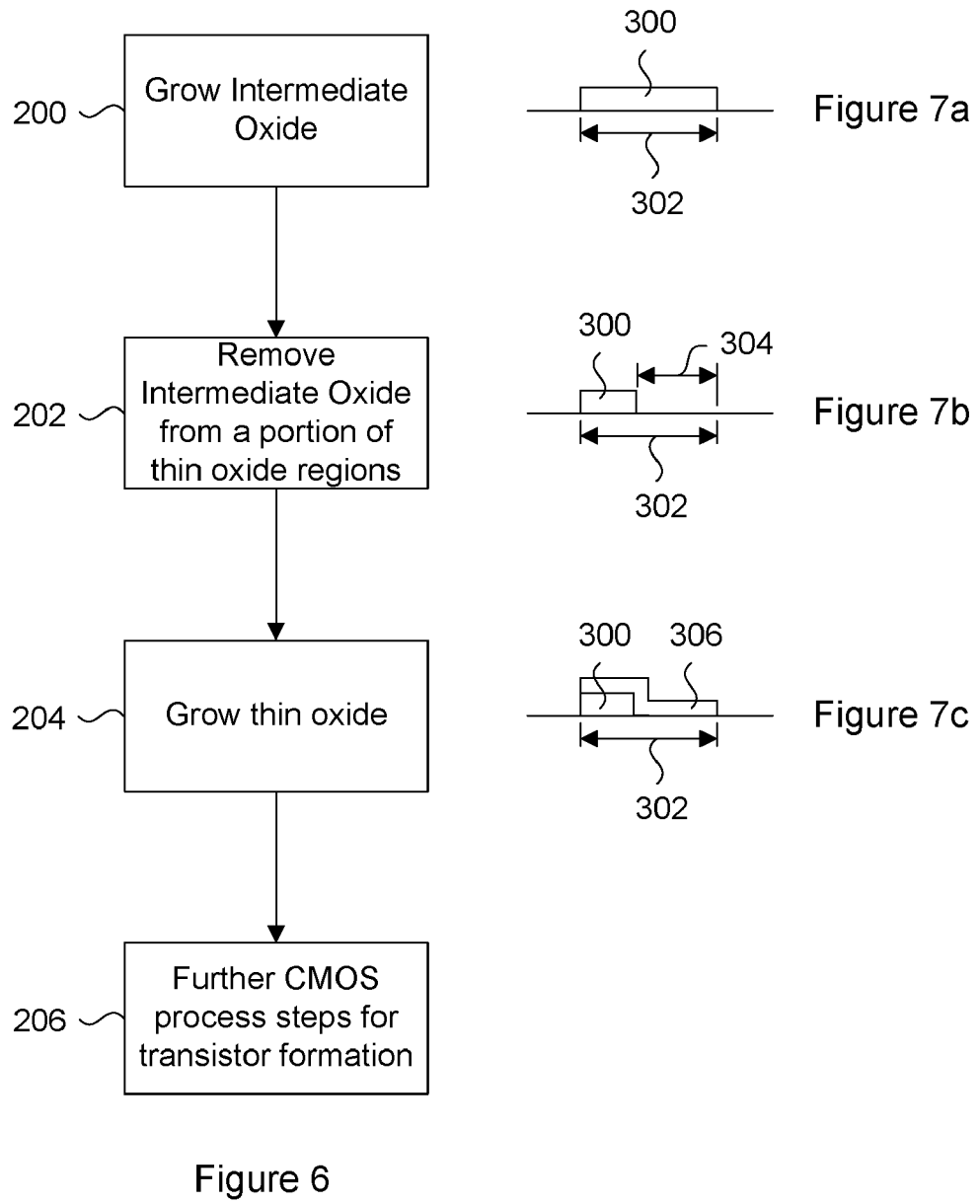
FIG. 6 is a flow chart of a method for forming a variable thickness gate oxide for the anti-fuse transistor of the present invention.

A method of creating a variable thick gate oxide from a standard CMOS process according to an embodiment of the present invention, is to utilize a well known two-step oxidation process. A flow chart outlining this process is shown in FIG. 6, while FIGS. 7a-7c show the various stages of the variable thickness gate oxide formation corresponding to specific steps in the process.

First, an intermediate gate oxide is grown in all active areas determined by the OD mask in step 200. In FIG. 7a, this is shown as the formation of intermediate gate oxide 300 on the substrate, over the channel region 302. In following step 202, the intermediate gate oxide 300 is removed from all the designated thin gate oxide areas using an OD2 mask. FIG. 7b shows the remaining portion of intermediate gate oxide 300 and the future thin oxide area 304. In the last gate oxide formation step 204, a thin oxide is grown again in all active areas as originally defined by the OD mask. In FIG. 7c, the thin gate oxide 306 is grown over the intermediate gate oxide 300 and the thin oxide area 304. In the present embodiment, the thick gate oxide is formed by a combination of removing intermediate gate oxide and growing thin gate oxide over the remaining intermediate gate oxide.

As a result, the formed thick gate oxide area covered by the OD2 mask during step 202 will have a gate oxide thickness being a combination of the intermediate gate oxide 300 and the final thin gate oxide 306. The same procedure can be extended for more than two oxidation steps, or other equivalent procedures can be used to produce two or more gate oxide thicknesses on the same die, which is determined by at least one thick gate oxide mask OD2.

Typically, the OD2 mask is considered a non-critical masking step, a low resolution mask is used and the design rules require a large margin of the OD2 mask over active gate areas and particularly, do not have provisions for the OD2 mask ending within the active gate area. According to the present invention, the OD2 mask ends within the active gate area creating a split-channel anti-fuse structure that features thicker gate oxide on the drain (i.e. diffusion contact) side and thinner gate oxide on the opposite side (either channel or non-connected source side). In principle, this technology requires that the gate length (polysilicon line width) should be larger then the process minimum and depends on actual OD2 mask tolerances, but otherwise does not require any process or mask grade change. The minimum gate length for the split channel anti-fuse structure can be approximated as a sum of minimum gate length for the thick and thin gate oxide. Those skilled in the art will appreciate that accurate calculations can be made based on mask tolerances, and the gate length can be minimized by tightening OD2 mask tolerances.

Once the variable thickness gate oxide has been formed, additional standard CMOS processing steps can be employed at step 206 to complete the anti-fuse transistor structure as shown in FIG. 4. This can include formation of the polysilicon gate, LDD regions, sidewall spacers, RPO, and diffusion regions, and salicidation, for example. According to a preferred embodiment of the presently discussed process, a salicidiation step is included to salicide the polysilicon gate and the floating diffusion region of the anti-fuse transistor. An RPO is formed over the diffusion region before hand to protect it from the salicidation process. As previously mentioned, the salicided floating diffusion region will enhance oxide breakdown in the region.

One issue to consider for the above-mentioned anti-fuse transistors is the retention, or reliability or the unprogrammed cells. The described anti-fuse memory cell is programmed by forming a conductive channel between the polysilicon gate and the channel through the thin gate oxide. The resultant programmed state can be detected in a read operation by applying a read voltage to the gate and sensing the voltage of the bitline the anti-fuse is connected to. The typical read voltage is 1.5V to 2.0V depending on process technology. This voltage may exceed the maximum voltage allowed for a DC bias on the gate of the low voltage transistor part of the cell (for example 1.1V for a 1V devices). In otherwords, the read voltage may be sufficiently high to program cells which are to remain in the unprogrammed state. One factor for maximizing reliability of unprogrammed anti-fuse cells is to minimize the area of the thin gate oxide of the variable thickness gate oxide.

Figure 8B:
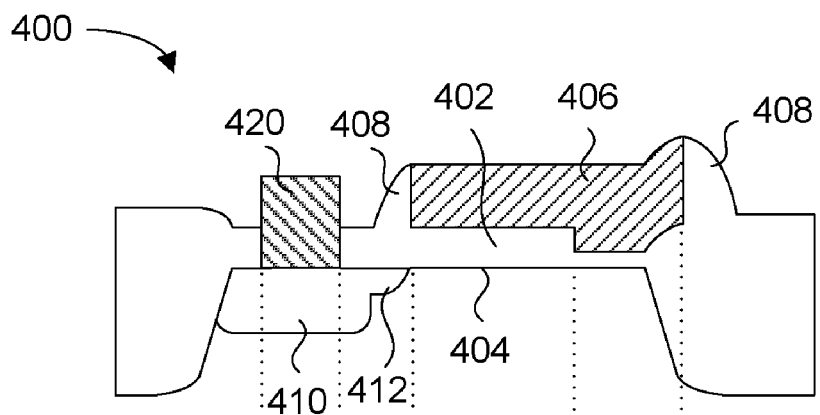
FIG. 8b is a cross-sectional view of the anti-fuse transistor of FIG. 8a taken along line A-A.
Figure 8A:
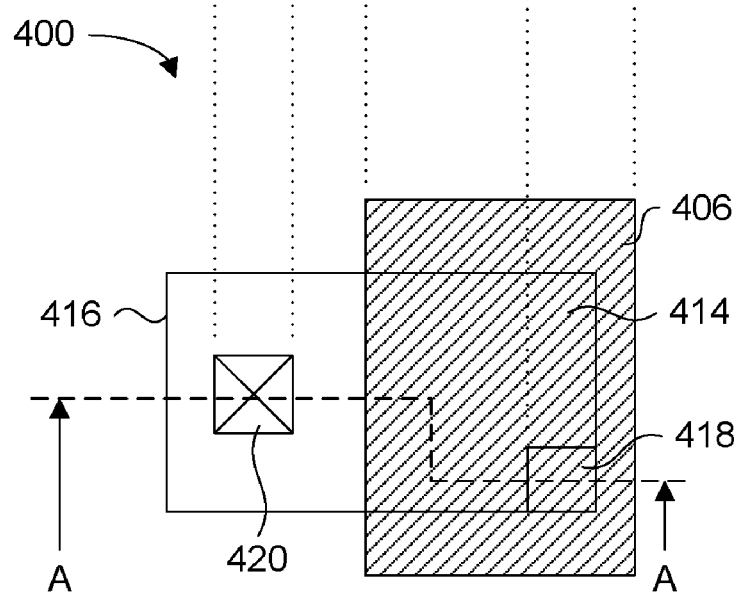
FIG. 8a is a planar layout of an anti-fuse transistor according to an embodiment of the present invention.

FIG. 8a shows a planar view of an anti-fuse transistor having a minimized thin gate oxide area that can be manufactured with any standard CMOS process, according to an embodiment of the present invention. For example, the fabrication steps outlined in FIG. 6 can be used. FIG. 8b shows a cross-sectional view of the anti-fuse transistor of FIG. 8a, taken along line A-A. Anti-fuse 400 of FIG. 8a is very similar to anti-fuse 100 shown in FIG. 5a, except that the area of the thin gate oxide of the variable thickness gate oxide beneath the polysilicon gate is minimized.

Anti-fuse transistor 400 includes a variable thickness gate oxide 402, formed on the substrate channel region 404, a polysilicon gate 406, sidewall spacers 408, a diffusion region 410, and an LDD region 412 in the diffusion region 410. The variable thickness gate oxide 402 consists of a thick oxide and a thin gate oxide such that a majority area of the channel length is covered by the thick gate oxide and a small minority area of the channel length is covered by the thin gate oxide. As shown in FIG. 8a, the thick gate oxide area 414 covers most of the active area 416 under polysilicon gate 406, except for a small square thin gate oxide area 418. Anti-fuse transistor 400 can be a non-volatile memory cell, and hence will have a bitline contact 420 in electrical contact with diffusion region 410. The formation of the shape and size of thick gate oxide area 414 and thin gate oxide area 418 is discussed in further detail below.

Figure 9:
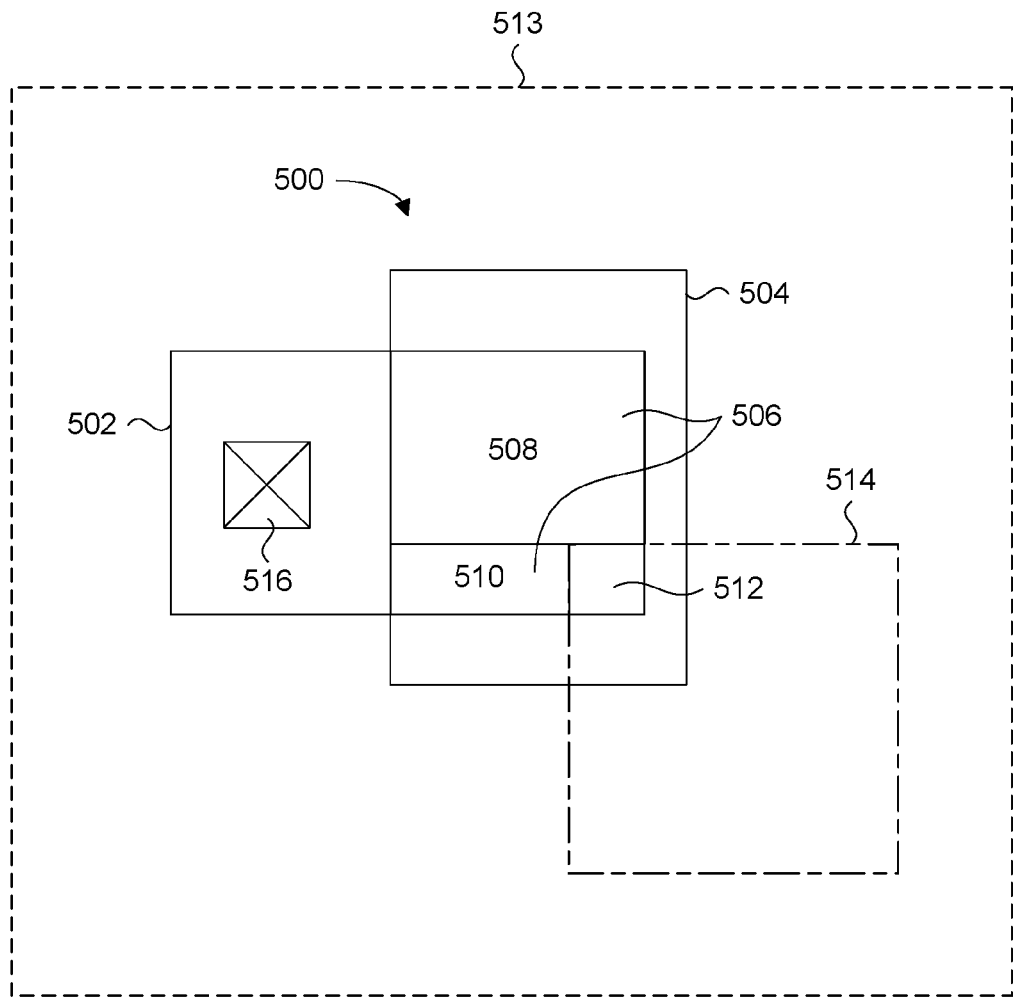

FIG. 9 is an enlarged planar view of the anti-fuse transistor of FIG. 8a to highlight the planar geometry of the variable thickness gate oxide. Anti-fuse transistor 500 consists of an active area 502 with overlying polysilicon gate 504. In FIG. 9, shading from the polysilicon gate has been removed to clarify the features underneath it. The variable thickness gate oxide is formed between the active area 502 and polysilicon gate 504, and consists of a thick gate oxide area 506. According to the present embodiment, thick gate oxide area 506 can be considered as at least two rectangular segments. Those skilled in the art will understand that the delineation of the segments is a visual breakdown of the thick gate oxide shape into constituent rectangular shapes. The first thick gate oxide segment 508 extends from a first end of the channel region, coinciding with the left-most edge of the polysilicon gate 504, to a second end of the channel region. Segment 508 can be seen as a rectangular shaped area having a width less than the width of the channel region. The second thick gate oxide segment 510 is adjacent to the first segment 508, and extends from the same first end of the channel region to a predetermined distance of the channel length. The second thick gate oxide segment 510 has a width substantially equal to the difference between the channel width and the width of the first segment 508.

Because the second thick gate oxide segment 510 ends in the channel region, the remaining area is also rectangular in shape as it is bound on two sides by segments 508 and 510, and on the other two sides by the edges of the active area 502. This remaining area is the thin gate oxide area 512. While the OD2 mask 513 defines the areas within which thick oxide is to be formed, the OD2 mask 513 has a rectangular opening 514 in which no thick oxide is to be formed. Thin gate oxide will be grown within the area defined by opening 514. Expressed in the alternate, the areas outside of the rectangular outline 514 is where thick gate oxide is formed. Dashed outline 513 can represent an OD2 mask used during the fabrication process, which is positioned such that a corner of the opening 514 overlaps a corner of the active area 502 underneath the polysilicon gate 504. The dimensions of opening 514 can be selected to be any size, but has a preferred set of dimensions, as will be discussed with reference to FIG. 10. In the single transistor anti-fuse memory cell, a bitline contact 516 is formed for electrical connection to a bitline (not shown).

Figure 10:
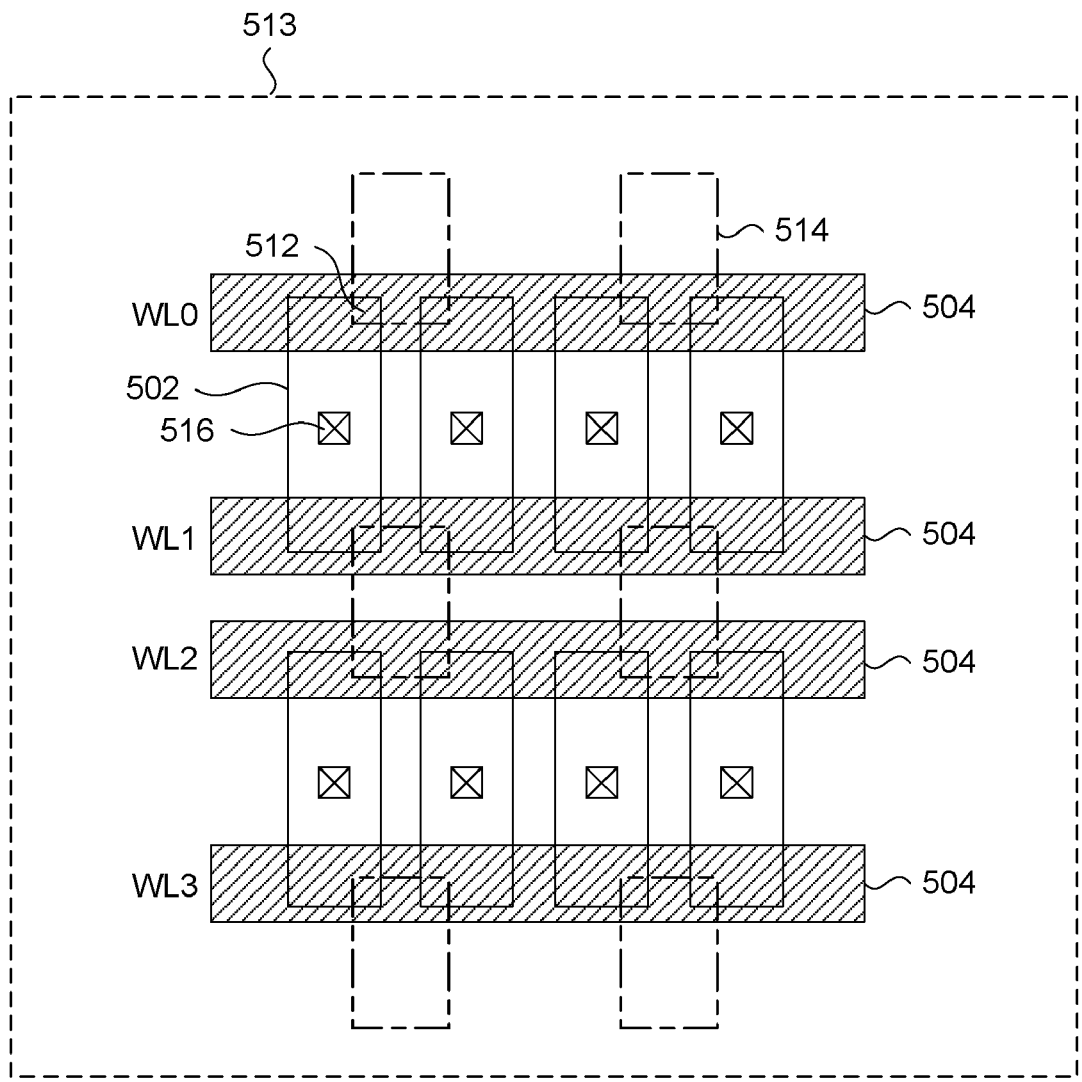
FIG. 10 is a planar layout of a memory array using the anti-fuse transistor of FIG. 8a according to an embodiment of the present invention.

FIG. 10 is a planar layout of a memory array consisting of the anti-fuse memory cell of FIG. 9 according to an embodiment of the present invention. The memory array has anti-fuse memory cells arranged in rows and columns, where polysilicon gates 504, formed as continuous polysilicon lines, extend over the active areas 502 of each anti-fuse memory cell in a row. Each polysilicon line is associated with a logical wordline WL0, WL1, WL2 and WL3. In the presently shown embodiment, each active area 502 has two polysilicon gates 504, thereby forming two anti-fuse transistors that share the same bitline contact 516 and active area 502.

The openings 514 in the OD2 mask 513 for defining the areas where the thin gate oxide is to be grown is rectangular in shape and sized and positioned such that each of its four corners overlaps with the corner areas of four anti-fuse transistor active areas 502, thereby defining the thin gate oxide areas 512. Ideally, the thin gate oxide area has at least one dimension below the minimum feature size of the fabrication process which can be obtained through the overlap between two mask regions. One mask region is the diffusion mask, also called the active area mask, and the second mask region is the rectangular opening 514 in the OD2 mask 513. Both masks are of a non-critical width, meaning that they are greater than the minimum allowable width. Hence, by positioning the overlap of the two masks, the area of the thin gate oxide areas 512 can have dimensions approximately equal to or below the minimum feature size of the given fabrication process, or technology. Therefore, the dimensions of rectangular shaped opening 514 is selected based on the spacing between horizontally adjacent active areas 502 and the spacing between vertically adjacent active areas 502, such that the overlap area between the corners of the opening 514 and the diffusion mask for defining the active areas 502 is smaller than or equal to the minimum feature size of the fabrication technology.

The dimensions of opening 514 are selected to minimize the square or rectangular shaped thin gate oxide areas 512. Those skilled in the art will understand that the selected dimensions will take into account alignment error and fabrication anomalies such as cornering of the 90 degree edges. A high degree of accuracy for the fabrication of the thin gate oxide area 512 can be obtained by using a high grade mask. A high grade mask is provided by using higher quality glass, materials and/or mask printing equipment.

Therefore, the reliability of unprogrammed anti-fuse cells having this minimized feature size thin gate oxide area 512 is greatly improved. The shape of the thin gate oxide area 512 is rectangular, or square, resulting in a minimized area. According to alternate embodiments, instead of having a single rectangular shaped opening 514 overlap with four anti-fuse active areas 502 as shown in FIG. 10, multiple smaller openings can be used. For example, an opening can be shaped to overlap only two horizontally adjacent active areas 502. Or, an opening can be shaped to overlap only two vertically adjacent active areas 502. Furthermore, individual rectangles larger in size than the desired thin gate oxide area 512 can be used to overlap each active area 502. While any number of rectangles of any size are contemplated by the previously shown embodiment, the thin gate oxide can be triangular in shape.

The anti-fuse transistors are programmed by rupturing the thin gate oxide, preferably at the thin/thick gate oxide boundary. This is accomplished by applying a high enough voltage differential between the gate and the channel of the cells to be programmed and a substantially lower voltage differential, if any, on all other cells. Therefore, once a permanent conductive link is formed, a current applied to the polysilicon gate will flow through the link and the channel to the diffusion region, which can be sensed by conventional sense amplifier circuits. For example, a VPP high voltage level can be applied to a polysilicon gate 504 while a lower voltage such as ground is applied to its corresponding bitline. Memory cells not to be programmed will have their bitlines biased to a voltage higher than ground, such as VDD for example. Although programming circuitry is not shown, those of skill in the art will understand that such circuits can be coupled to the bitlines, and incorporated into the wordline driver circuits. Reading an anti-fuse memory cell can be done by precharging the bitlines to ground and applying a read voltage, such as VDD, to the polysilicon gates. A programmed anti-fuse having a conductive link will pull its corresponding bitline towards VDD. An unprogrammed anti-fuse with an absence of a conductive link will behave like a switched capacitor, featuring very low leakage current. Therefore, the bitline voltage will not change substantially, if at all. The voltage change can be sensed by a bitline sense amplifier.

Figure 11:
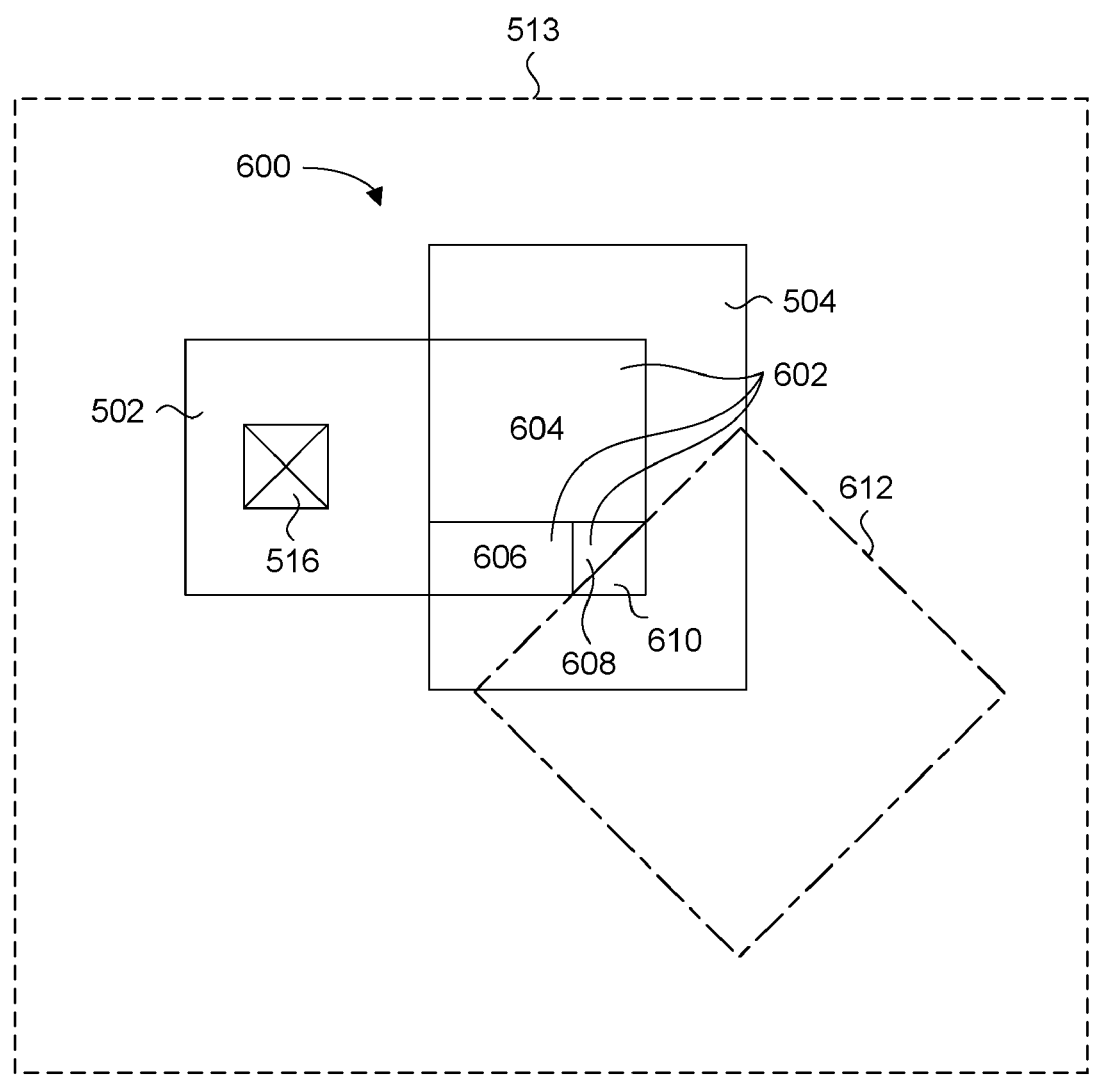
FIG. 11 is an enlarged planar layout of an anti-fuse transistor, according to another embodiment of the present invention.

FIG. 11 is an enlarged planar layout of an anti-fuse transistor according to another embodiment of the present invention. Anti-fuse transistor 600 is virtually identical to anti-fuse transistor 500, and therefore has the same active area 502, polysilicon gate 504, and bitline contact 516. Anti-fuse transistor 600 has a differently shaped variable thickness gate oxide. The thick gate oxide area 602 can be seen as being composed of at least two rectangular segments and a triangular segment. A first thick gate oxide segment 604 extends from a first end of the channel region, coinciding with the left-most edge of the polysilicon gate 504, to a second end of the channel region. Segment 604 can be seen as a rectangular shaped area having a width less than the width of the channel region. The second thick gate oxide segment 606 is adjacent to the first segment 604, and extends from the same first end of the channel region to a predetermined distance of the channel length. The second thick gate oxide segment 606 has a width substantially equal to the difference between the channel width and the width of the first segment 604. The third gate oxide segment 608 is triangular in shape and has its 90 degree sides adjacent to the first thick gate oxide segment 604 and the second thick gate oxide segment 606. Segment 606 can include segment 608, such that the predetermined distances is set by the diagonal edge of segment 608. The remaining triangular area having 90 degree sides formed by the edges of the active area 502 is the thin gate oxide area 610.

The dashed diamond-shaped area 612 defines openings in the OD2 mask 513 in which the thin gate oxide is to be grown. Expressed in the alternate, the areas outside of the diamond-shaped outline 612 and within OD2 mask 513 is where thick gate oxide is formed. Dashed outline 612 is the opening in the OD2 mask 513 that is used during the fabrication process, and positioned such that an edge of the opening 612 overlaps a corner of the active area 502 underneath the polysilicon gate 504. In the presently shown embodiment, opening 612 is a 45 degree rotated version of opening 514 of FIG. 9. The dimensions of opening 612 can be selected to be any size, but has a preferred set of dimensions, as will be discussed with reference to FIG. 12.

Figure 12:
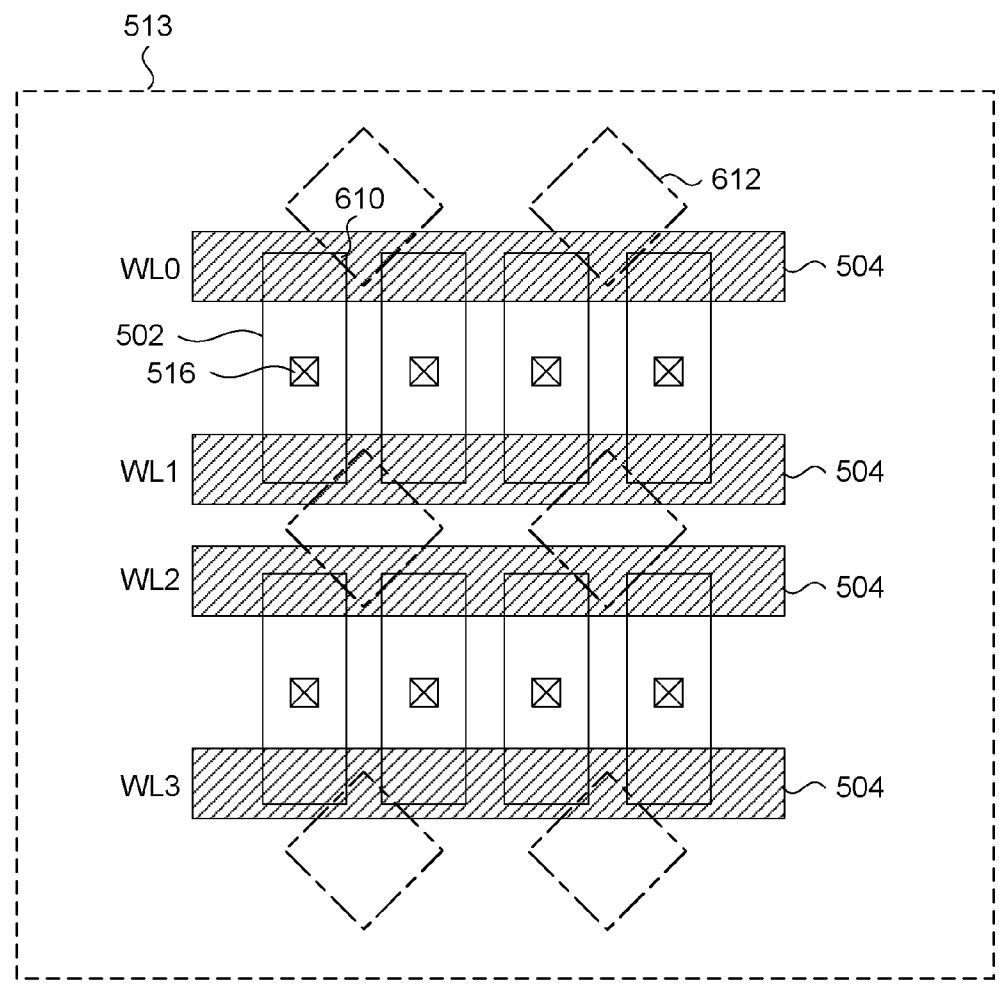
FIG. 12 is a planar layout of a memory array using the anti-fuse transistor of FIG. 11 according to an embodiment of the present invention.

FIG. 12 is a planar layout of a memory array consisting of the anti-fuse memory cell of FIG. 11 according to an embodiment of the present invention. The memory array has anti-fuse memory cells arranged in rows and columns, where polysilicon gates 504, formed as continuous polysilicon lines, extend over the active areas 502 of each anti-fuse memory cell in a row. The layout configuration of the polysilicon gates 504 with respect to the active areas 502 is identical to that shown in FIG. 10.

The openings 612 in OD2 mask 513 for defining the areas where the thin gate oxide is to be grown is diamond-shaped and sized and positioned such that each of its four edges overlaps with the corner areas of four anti-fuse transistor active areas 502, thereby defining the thin gate oxide areas 610. Ideally, each thin gate oxide area 610 is below the minimum feature size of the fabrication process. The overlap is between two mask regions, one being the diffusion mask also called the active area mask, and the second being the OD2 mask 513 having the diamond-shaped openings 612. It is noted that while the openings 612 are considered diamond-shaped relative to the other features, i.e. the polysilicon gates 504 and active areas 502 which are defined with lines at 90 degrees to each other. Therefore, relative to these features, the openings 612 are diamond-shaped and preferably has defining lines 45 degrees relative to the defining lines of the polysilicon gates or the active areas 502.

Once again, both masks are of a non-critical width, meaning that they are greater than the minimum allowable width. Hence, by positioning the overlap of the two masks, the area of the thin gate oxide areas 610 can have a size that is approximately equal to or below the minimum feature size of the given fabrication process, or technology. Therefore, the dimensions of the diamond-shaped opening 612 is selected based on the spacing between horizontally adjacent active areas 502 and the spacing between vertically adjacent active areas 502, such that the overlap area between the corners of the openings 612 and the diffusion mask for defining the active areas 502 is smaller than or equal to the minimum feature size of the fabrication technology.

The dimensions of diamond-shaped opening 612 are selected to minimize the triangular shaped thin gate oxide areas 610. The selected dimensions will take into account alignment error and fabrication anomalies, and a high grade mask can be used to tighten fabrication tolerances.

The previously described embodiments of the non-volatile memory cell are directed to a single anti-fuse transistor memory cell. The variable thickness gate oxide can have a thick gate oxide substantially identical to the gate oxides used for high voltage transistors on the same chip. Similarly, the variable thickness gate oxide can have a thin gate oxide substantially identical to the gate oxides used for low voltage transistors on the same chip. Of course, both the thick and thin gate oxide areas can have thicknesses tailored just for the memory array.

Figure 13B:
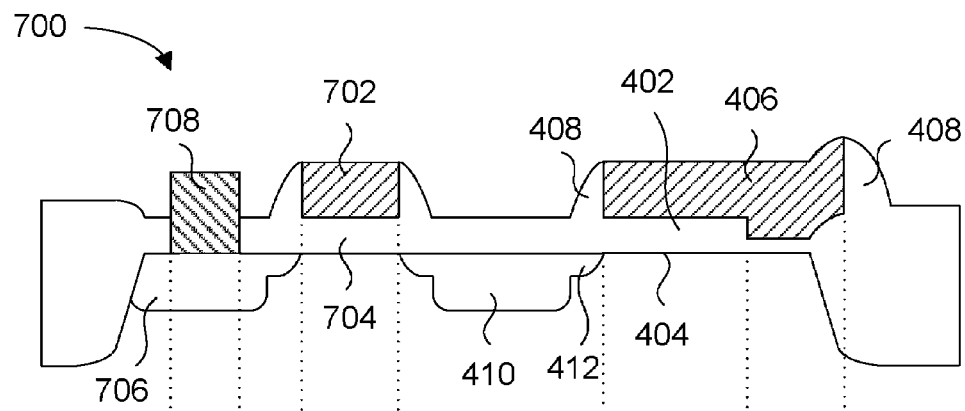
FIG. 13b is a cross-sectional view of the two-transistor anti-fuse memory cell of FIG. 13a taken along line B-B.
Figure 13A:
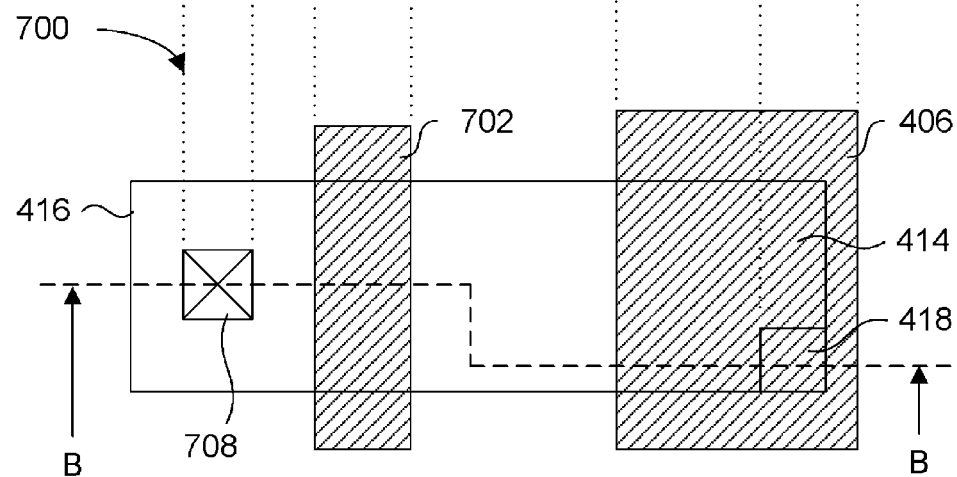
FIG. 13a is a planar layout of a two-transistor anti-fuse memory cell according to an embodiment of the present invention.

According to further embodiments of the present invention, an access transistor can be formed in series with the anti-fuse transistor to provide a two-transistor anti-fuse cell. FIGS. 13a and 13b are illustrations of a two-transistor anti-fuse memory cell according to an embodiment of the present invention.

FIG. 13a shows a planar view of a two-transistor anti-fuse memory cell 700 having a minimized thin gate oxide area that can be manufactured with any standard CMOS process, according to an embodiment of the present invention. FIG. 13b shows a cross-sectional view of the memory cell 700 of FIG. 13a, taken along line B-B. Two-transistor anti-fuse memory cell 700 consists of an access transistor in series with an anti-fuse transistor. The structure of the anti-fuse transistor can be identical to those shown in FIGS. 8a to 12. For the present example, it is assumed that the anti-fuse transistor is identical to the one shown in FIG. 8b, and hence the same reference numerals indicate the same previously described features. More specifically, the structure of the variable thickness gate oxide is the same as shown in FIG. 8b, except that the diffusion region 410 does not have a bitline contact formed on it.

The access transistor has a polysilicon gate 702 overlying a gate oxide 704. Formed to one side of the gate oxide 704 is the shared diffusion region 410. Another diffusion region 706 is formed on the other side of the gate oxide 704, which will have a bitline contact 708 formed on it. Both diffusion regions can have LDD regions adjacent to the vertical edges of gate oxide 704. Those skilled in the art will understand that the diffusion region 706 can be doped identically to diffusion region 410, but can be doped differently depending on the desired operating voltages to be used.

As previously described, the variable thickness gate oxide 402 has a thick gate oxide area and a thin gate oxide area. The thickness of gate oxide 704 will be the same as the thickness of the thick gate oxide area of the variable thickness gate oxide 402. In one embodiment, the access transistor can be fabricated using a high voltage transistor process, or the same process used to form the thick gate oxide area of variable thickness gate oxide 402. The polysilicon gate 702 can be formed concurrently with polysilicon gate 406.

The operation of the two-transistor anti-fuse memory cell is similar to that of the previously described single transistor anti-fuse cell. Programming the anti-fuse transistor requires the application of a high voltage to the VCP polysilicon lines while maintaining the bitlines at ground. The access transistor is turned on to couple the shared diffusion region to ground (via a bitline).

Figure 14:
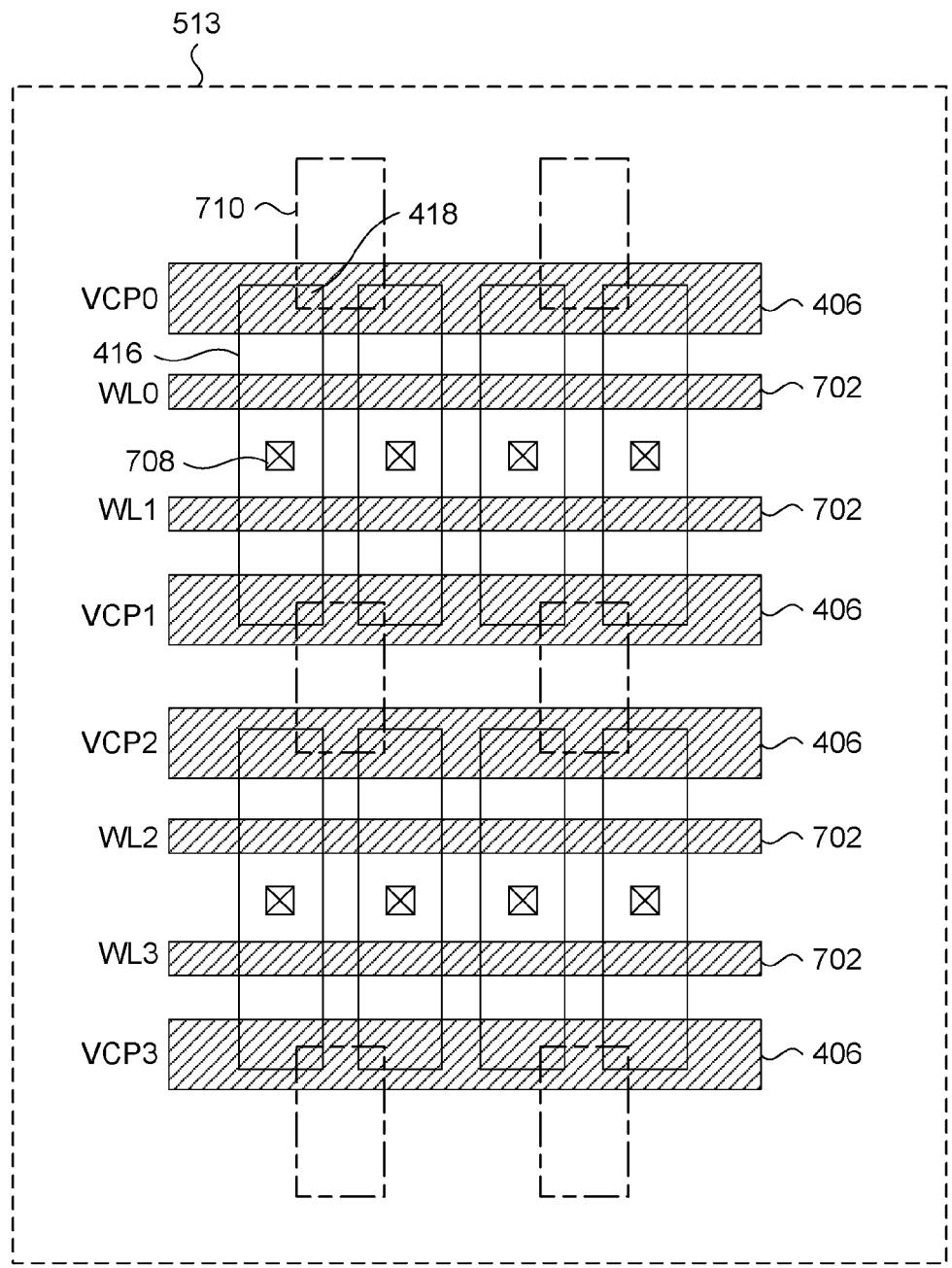
FIG. 14 is a planar layout of a memory array using the two-transistor anti-fuse memory cell of FIGS. 13a and 13b, according to an embodiment of the present invention.

FIG. 14 is a planar layout of a memory array consisting of the two-transistor anti-fuse memory cell of FIGS. 13a and 13b according to an embodiment of the present invention. The memory array has memory cells arranged in rows and columns, where the polysilicon gates 406, formed as continuous polysilicon lines, extend over the active areas 416 of each anti-fuse memory cell in a row. Each polysilicon line is associated with a logical cell plate VCP0, VCP1, VCP2 and VCP3. The polysilicon gates 702 are formed as continuous polysilicon lines which extend over the active areas 416 of each anti-fuse memory cell in a row. These polysilicon lines are associated with logical wordlines WL0, WL1, WL2 and WL3. In the presently shown embodiment, each active area 416 has two pairs of polysilicon gates 406/702, thereby forming two anti-fuse transistors that share the same bitline contact 708 and active area 416.

The openings 710 in OD2 mask 513 for defining the areas where the thin gate oxide is to be grown is rectangular in shape and sized and positioned such that each of its four corners overlaps with the corner areas of four anti-fuse transistor active areas 416, thereby defining the thin gate oxide areas 418. The same relative mask overlap criteria described for the embodiment FIG. 10 applies to the present embodiment. The dimensions of rectangular shaped openings 710 is selected based on the spacing between horizontally adjacent active areas 416 and the spacing between vertically adjacent active areas 416, such that the overlap area between the corners of the openings 710 and the diffusion mask for defining the active areas 416 is smaller than or equal to the minimum feature size of the fabrication technology.

The embodiment of FIG. 14 is configured to having separately controlled cell plates VCP0, VCP1, VCP2 and VCP3, which allows for improved control to prevent unintentional programming of unselected cells. In an alternate embodiment, VCP0, VCP1, VCP2 and VCP3 can be connected to a common node. In such an embodiment, a specific programming sequence is used to prevent unintentional programming of unselected cells. The programming sequence for the alternate embodiment starts with a precharge of all wordlines and bitlines to a high voltage level, followed by driving the common cell plate to a programming voltage VPP. Using the embodiment of FIG. 13b for example, this would result in precharging the diffusion region 410 to a high voltage level. The wordline to be programmed is selected by deselecting all of the other wordlines, ie, by driving them to a low voltage level for example. Then, the bitline voltage connected to the selected memory cell is driven to a low voltage level, such as ground for example.

Figure 15:
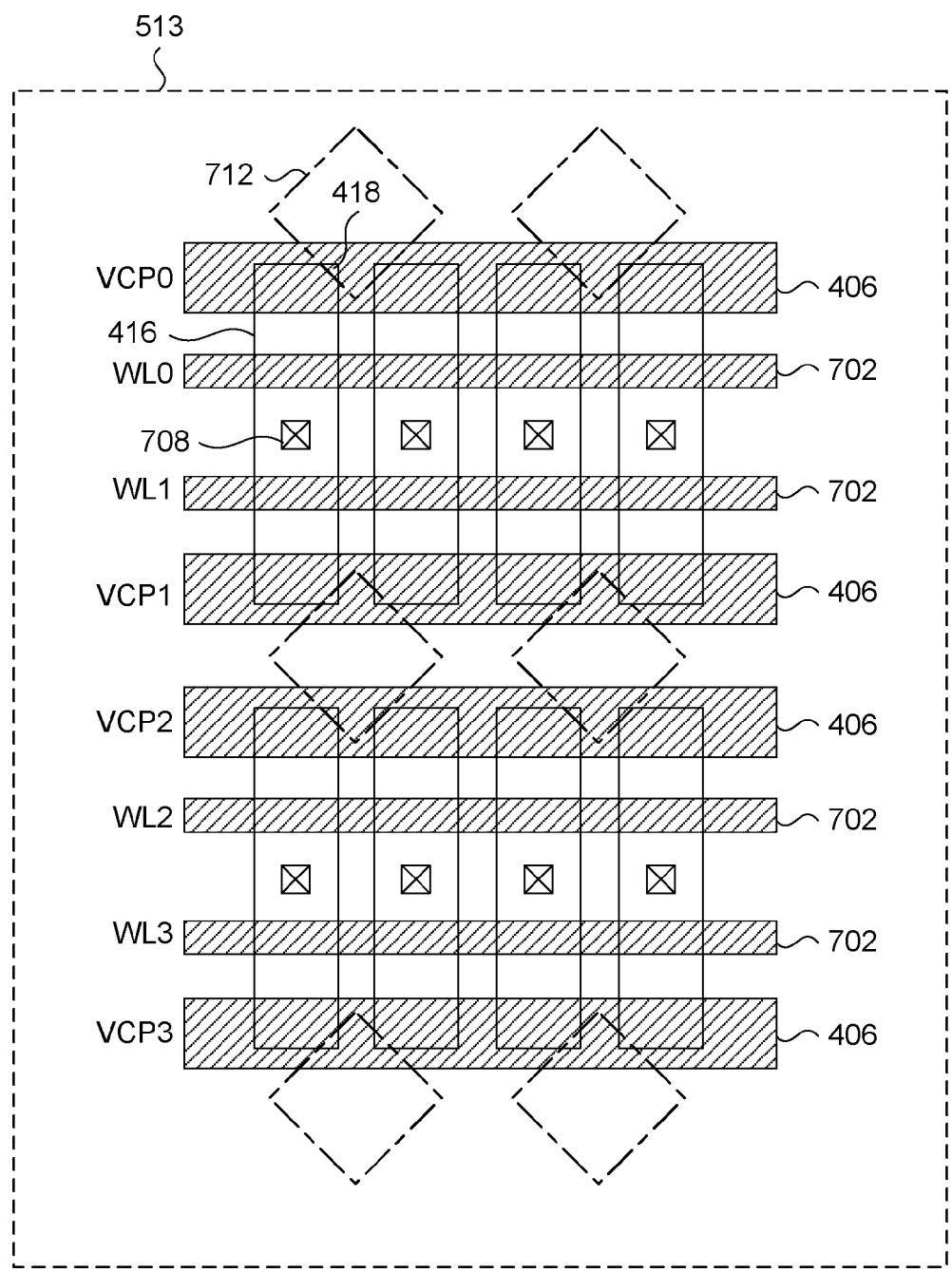
FIG. 15 is a planar layout of a memory array using the two-transistor anti-fuse memory cell according to an alternate embodiment of the present invention.

FIG. 15 is a planar layout of a memory array consisting of the two-transistor anti-fuse memory cell according to an alternate embodiment of the present invention. The memory array of FIG. 15 is identical to that of FIG. 14, except that a diamond-shaped opening 712 withing OD2 mask 513 is used for defining the thin gate oxide areas of the variable thickness gate oxides. The same relative mask overlap criteria described for the embodiment FIG. 12 applies to the present embodiment.

Figure 16:
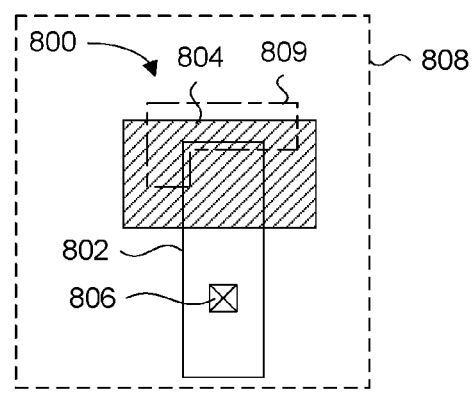
FIG. 16-20 are planar layouts of alternate anti-fuse memory cells, according to embodiments of the present invention.

In the previously disclosed embodiments of the invention, one of the thick gate oxide segments has a length extending from one end of the channel region to the other end of the channel region. According to an alternate embodiment, the length of this thick gate oxide segment is slightly reduced such that it does not fully extend across the full length of the channel region. FIG. 16 is a planar layout of an anti-fuse transistor according to an alternate embodiment of the present invention. In FIG. 16, the anti-fuse transistor 800 includes an active area 802, a polysilicon gate 804 and a bitline contact 806. The active area 802 underneath the polysilicon gate 804 is the channel region of anti-fuse transistor 800. In the present embodiment, OD2 mask 808 defines the area within which thick oxide is to be formed, and includes an "L"-shaped opening 809 overlapping an active area 802, within which thin gate oxide will be grown. This embodiment is similar to that shown in FIG. 9, except that one thick gate oxide segment (i.e. 508) extends to a first predetermined distance between the channel region top edge and a second predetermined distance for the adjacent thick gate oxide segment (ie. 510). Therefore, the thin gate oxide will be grown between the first predetermined distance and the channel region top edge, and the second predetermined distance and the channel region top edge.

Figure 17A:
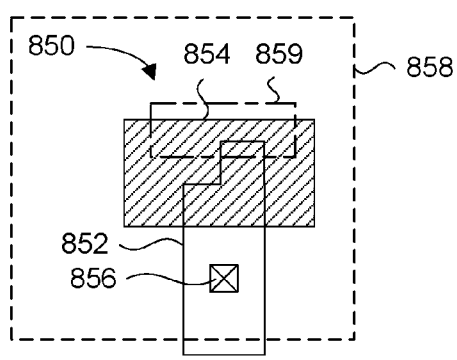

The previously described embodiments of the anti-fuse transistor have channel regions of a constant width. According to further embodiments, the channel region can have a variable width across the length of the channel region. FIG. 17a is a planar layout of an anti-fuse transistor according to an alternate embodiment of the present invention. In FIG. 17a, the anti-fuse transistor 850 includes an active area 852, a polysilicon gate 854 and a bitline contact 856. The active area 852 underneath the polysilicon gate 854 is the channel region of anti-fuse transistor 850. In the present embodiment, OD2 mask 858 defines the area within which thick oxide is to be formed, and includes a rectangular-shaped opening 859 overlapping the active area 852, within which thin gate oxide will be grown. The active area underneath the polysilicon gate 854 is "L"-shaped, and the rectangular opening 859 has a bottom edge that ends at a predetermined distance the channel region top edge.

Figure 17B:
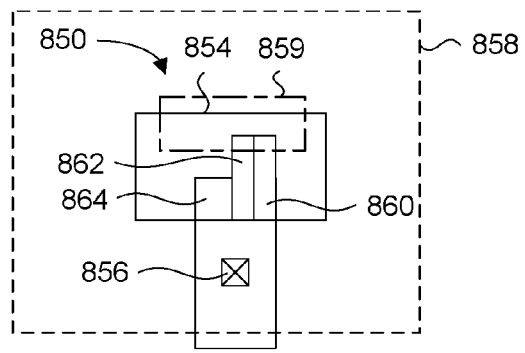

FIG. 17b shows the same anti-fuse transistor 850 without shading of the polysilicon gate 854 to illustrate the thick gate oxide segments of the channel region. In the present embodiment, a first thick gate oxide segment 860 extends from the diffusion edge of the channel region to a first predetermined distance defined by the bottom edge of rectangular opening 859. A second thick gate oxide segment is L-shaped, and includes two sub-segments 862 and 864. Those skilled in the art will understand that the delineation of the sub-segments is a visual breakdown of the thick gate oxide segment shape into constituent rectangular shapes. Sub-segment 862 extends from the diffusion edge of the channel region to the first predetermined distance, while sub-segment 864 extends from the diffusion edge of the channel region to a second predetermined distance. The second predetermined distance is between the first predetermined distance and the diffusion edge of the channel region. The thin gate oxide region extends from the first predetermined distance of the first thick gate oxide segment 860 and the sub-segment 862 to the channel region top edge.

Figure 18A:
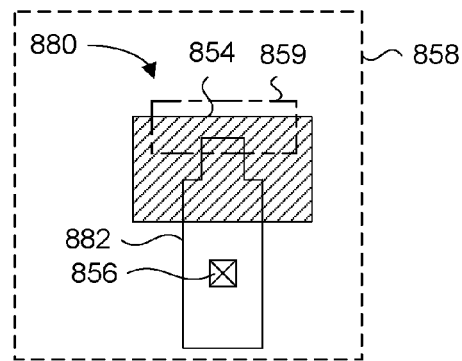
Figure 18B:
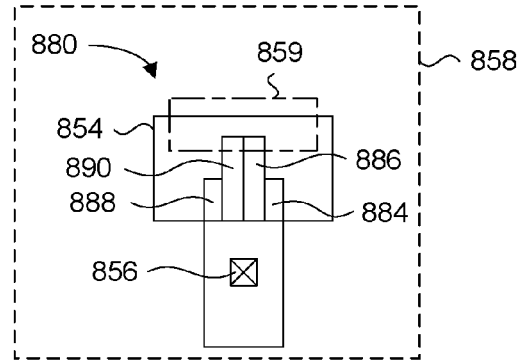

FIG. 18a is a planar layout of an anti-fuse transistor according to an alternate embodiment of the present invention. In FIG. 18a, the anti-fuse transistor 880 includes the same features as those in FIG. 17. In the present embodiment, the active area underneath the polysilicon gate 854 is "T"-shaped, and the rectangular opening 859 has a bottom edge that ends at a predetermined distance from the channel region top edge. FIG. 18b shows the same anti-fuse transistor 880 without shading of the polysilicon gate 854 to illustrate the thick gate oxide segments of the channel region.

In the present embodiment, there is a first thick gate oxide segment and a second gate oxide segment. The first thick gate oxide segment is L-shaped, and includes two sub-segments 884 and 886. The second thick gate oxide segment is L-shaped, and includes two sub-segments 888 and 890. Sub-segment 886 extends from the diffusion edge of the channel region to a first predetermined distance, the first predetermined distance corresponding to a bottom edge of the rectangular opening 859. Sub-segment 884 extends from the diffusion edge of the channel region to a second predetermined distance, where the second predetermined distance is between the first predetermined distance and the diffusion edge of the channel region. Sub-segments 888 and 890 of the second thick gate oxide segment are identically configured to sub-segments 884 and 886 respectively. The thin gate oxide region extends from the first predetermined distance of sub-segments 886 and 890 to the channel region top edge.

In the previously described embodiments of FIGS. 17a and 18a, the thin gate oxide area extends from a bottom edge of the rectangular opening 859 to the channel region top edge. Because the channel region has a variable width, in which a portion proximate to the diffusion edge is larger than the portion proximate to the channel region top edge, the overall the thin gate oxide area can be smaller than the anti-fuse embodiment shown in FIG. 5a. According to further embodiments, the thin gate oxide of the anti-fuse transistor embodiments of FIGS. 17a and 18a are further minimized by applying an OD2 mask having the rectangular or diamond-shaped openings shown in FIGS. 9 and 11.

Figure 19:
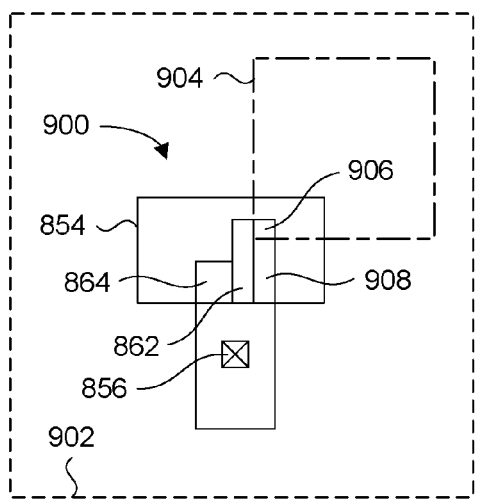

FIG. 19 is a planar layout of an anti-fuse transistor according to an alternate embodiment of the present invention. Anti-fuse transistor 900 is similar to anti-fuse transistor 850 of FIG. 17b, except that OD2 mask 902 includes rectangular opening 904 shaped and positioned for delineating the thin gate oxide area 906. In the presently shown embodiment, the thick gate oxide comprises a first thick gate oxide segment 908 and a second thick gate oxide segment having sub-segments 862 and 864. Sub-segments 862 and 864 are the same as in the embodiment of FIG. 17b. However, due to the overlapping corners of rectangular opening 904 and the channel region, the first thick gate oxide segment 908 only extends from the diffusion edge to a predetermined distance of the channel length. Hence, the thick gate oxide segment 908 is shorter in length than sub-segment 862. Accordingly, anti-fuse transistor 900 has a smaller thin gate oxide area than the embodiment of FIG. 17a. The application of the OD2 mask 902 with rectangular openings 904 can be applied to anti-fuse transistor 880 of FIG. 18b with the same result.

Figure 20:
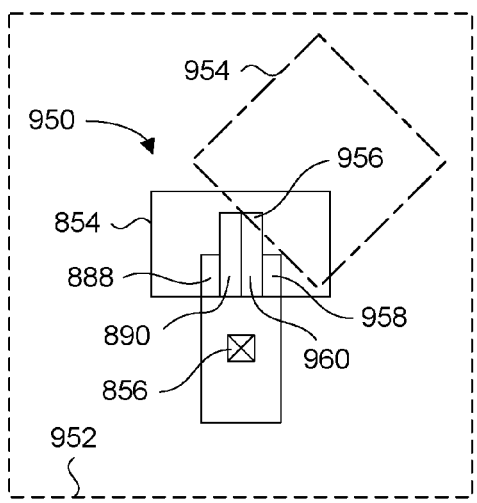

A further reduction in the thin gate oxide area of the anti-fuse transistors 850 and 880 is obtained by applying diamond-shaped openings in the OD2 mask, as illustrated earlier in FIG. 11. FIG. 20 is a planar layout of an anti-fuse transistor according to an alternate embodiment of the present invention. Anti-fuse transistor 950 is similar to anti-fuse transistor 880 of FIG. 18b, except that OD2 mask 952 includes rectangular opening 954 shaped and positioned for delineating the thin gate oxide area 956. In the presently shown embodiment, the thick gate oxide comprises first and second thick gate oxide segments. The first thick gate oxide segment includes sub-segments 888 and 890, which are the same as in the embodiment of FIG. 18b. The second thick gate oxide segment includes sub-segments 958 and 960.

Due to the overlap of diamond-shaped opening 954 and the channel region, the second thick gate oxide sub-segment 960 only extends from the diffusion edge to a predetermined distance of the channel length, the predetermined distance being defined by the diagonal edge of the diamond-shaped opening 954. Accordingly, anti-fuse transistor 950 can have a smaller thin gate oxide area than the embodiment of FIG. 19. The application of the OD2 mask 952 with diamond-shaped opening 954 can be applied to anti-fuse transistor 850 of FIG. 17b with the same result. It is noted that the dimensions of sub-segments 958 and 960 are selected such that the diagonal edge of opening 954 does not overlap with the channel region covered by sub-segment 958.

While rectangular and diamond-shaped openings in the OD2 mask are disclosed, other opening shapes can be used with equal effectiveness. For example, the openings in the OD2 mask can be hexagon-shaped, octagon-shaped, or even substantially circular after OPC is added. Furthermore a rectangular shaped opening can be rotated by any angle relative to the polysilicon gate.

The previously described embodiments of FIGS. 16-20 are directed to single transistor anti-fuse memory cells. The embodiments of FIGS. 16-20 are applicable to two-transistor anti-fuse cells, in which an access transistor is formed in series with the anti-fuse transistor. FIGS. 21-24 illustrate various embodiments of a two-transistor anti-fuse memory cell having minimized thin gate oxide areas.

Figure 21:
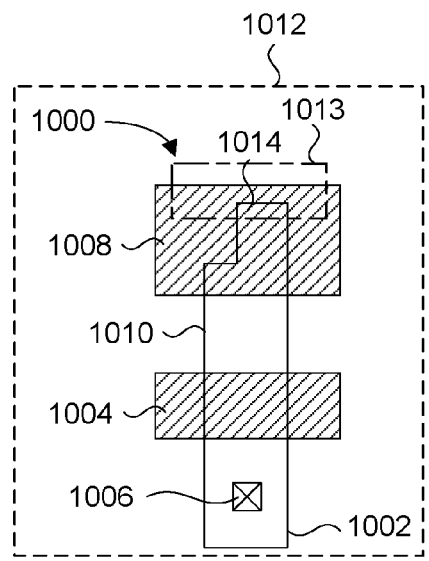
FIG. 21-24 are planar layouts of alternate two-transistor anti-fuse memory cells, according to embodiments of the present invention.

FIG. 21 is a planar layout of a two-transistor anti-fuse transistor according to an embodiment of the present invention.

According to further embodiments of the present invention, an access transistor can be formed in series with the anti-fuse transistor to provide a two-transistor anti-fuse cell. FIGS. 13a and 13b are illustrations of a two-transistor anti-fuse memory cell according to an embodiment of the present invention where the channel region has a variable width. Two-transistor anti-fuse memory cell 1000 is similar to the two-transistor cell 700 of FIG. 13a. The access transistor includes active area 1002, a polysilicon gate 1004 and a bitline contact 1006. The anti-fuse transistor includes active area 1002, a polysilicon gate 1008. A common source/drain diffusion region 1010 is shared between the access transistor and the anti-fuse transistor. Underneath the polysilicon gate 1008 and covering the channel region is the variable thickness gate oxide having a thick gate oxide area and a thin gate oxide area. OD2 mask 1012 illustrates the areas in which a thick gate oxide is to be formed, and includes a rectangular-shaped opening 1013 overlapping the active area 852, within which thin gate oxide will be grown. Thin gate oxide area 1014 covers the channel region between the bottom edge of the rectangular opening 1013 and the channel region top edge.

Figure 22:
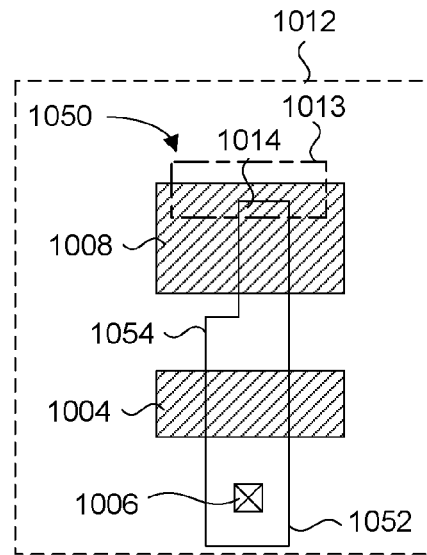

In FIG. 21 the channel region of the anti-fuse transistor has a variable width. In the embodiment of FIG. 22, the channel region of the anti-fuse transistor has a constant width, but is smaller in width than the remainder of the active area and the channel of the access transistor. More specifically, two-transistor anti-fuse memory cell 1050 is similar to memory cell 1000, except that active area 1052 is shaped such that the common source/drain diffusion region 1054 now has a variable width, leaving the channel region of the anti-fuse transistor constant, but smaller in width than the channel region of the access transistor.

Figure 23:
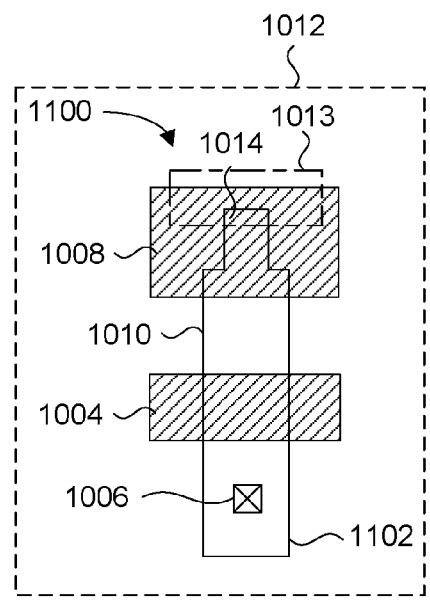
Figure 24:
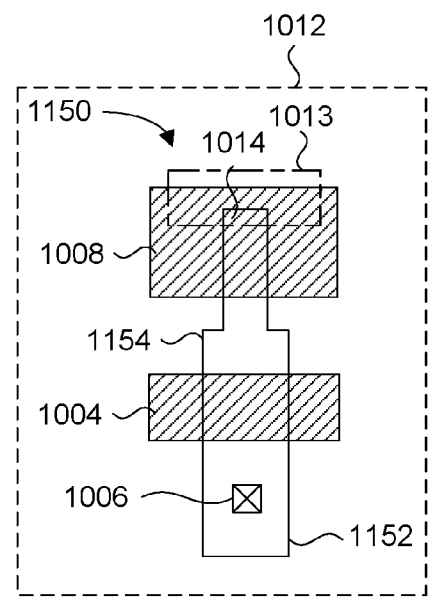

FIG. 23 is yet another alternate embodiment of the two-transistor anti-fuse memory cell. Two-transistor anti-fuse memory cell 1100 is similar to two-transistor anti-fuse memory cell 1000 of FIG. 21, except that the active area 1102 is shaped such that the anti-fuse transistor has a "T"-shaped channel region instead of the "L"-shaped channel region. FIG. 24 is similar to the embodiment of FIG. 23, except that two-transistor anti-fuse memory cell 1150 has an active area 1152 shaped such that the anti-fuse transistor has a channel region of a constant width. The common source/drain diffusion region 1154 is "T"-shaped such that it has a portion of narrower width.

The two-transistor anti-fuse memory cell embodiments of FIGS. 21-24 can use OD2 masks having rectangular or diamond-shaped openings positioned to minimize the thin gate oxide areas of the anti-fuse transistors.

As shown in the presently described embodiments, a single transistor anti-fuse memory cell and a two-transistor anti-fuse memory cell having high reliability can be manufactured using standard CMOS processes. The masks for defining the active areas and the OD2 masks can be non-critical in size but the positioned overlap between specific areas can result in a thin oxide area with a size less than the minimum feature size for the process technology.

More specifically, the standard CMOS process will require a set of masks for defining the various features of the presently described anti-fuse memory cell embodiments. Each mask will have different quality grades, depending on the features that are to be defined. Generally, higher grade masks are used for defining smaller sized features. Following is an example grading of masks used in the standard CMOS process, where higher numbers designate higher grade masks.

1. N-well, P-well, Vtp, Vtn, thick gate oxide (OD2) masks
2. source/drain implant mask
3. contact via mask
4. metal 2 layer mask
5. diffusion, thin oxide, contact and metal 1 layer masks
6. polysilicon mask The difference between a high grade mask, such as grade level 6, over a low grade mask, such as grade level 1, will be the better glass, materials or use of better printing equipment involved to make it. Different mask grades are used because certain features do not require high accuracy, while others do. As can be appreciated, the effort and cost for producing a high grade mask is substantially more than required for a low grade mask. For example, the lowest grade mask can range between $3 k-$5 k, while the highest grade mask can range between $100 k-$300 k.

It should be noted that design rules for certain features are set up to ensure that a specific area for that feature defined by a mask covers not only the specific area, but has some overlap onto adjacent features. In effect, the adjacent features truly control where the implantation occurs. For example, the OD2 shape will fully cover the 10 transistor area, which is defined by diffusion. Hence, it does not matter where the actual mask shape ends. This is one primary reason why the OD2 mask is a low grade, and consequently, a low cost mask, as there is an allowed margin of error. Furthermore, some aligner machines are capable of achieving 0.06 micron tolerance, but are only used at 0.1 micron as it is deemed sufficient for ion implant masks. For fabricating the anti-fuse transistors and memory arrays shown in FIGS. 4 to 15, the mask shape ends are important for defining the thin gate oxide area. The current grade OD2 mask used for typical CMOS processes can be used for defining the thin gate oxide areas of the described anti-fuse memory cells. However, the margin of error must be taken into account, thereby resulting in a memory cell having a particular minimum size.

According to an embodiment of the present invention, the anti-fuse memory cells of FIGS. 4-15 are fabricated using an OD2 mask having a grade corresponding to the mask grade used for source/drain implants (grade level 2) of the same process. The OD2 mask grade is preferably equivalent to the mask grade used for diffusion implants (grade level 5) of the same process to achieve smaller sized memory cells having high reliability. Therefore, higher density memory arrays, improved yield, improved performance and high reliability are obtained by using a high grade OD2 mask. The accuracy is further improved by ensuring that alignment of the mask is done at the highest possible accuracy level. High alignment accuracy is obtained by using superior lithography equipment, lithography methods and/or different light wavelengths and different mask types, any combination thereof being possible.

The use of a higher grade OD2 mask with optional high accuracy alignment presents advantages for the presently disclosed anti-fuse cell embodiments. More specifically, the more accurately formed mask shape ends using a high grade OD2 mask are advantageously used to minimize specific features such as the thin oxide areas. Since the anti-fuse transistors 500 and 600 should have a minimally sized thin gate oxide area (512 and 610), the use of a high grade OD2 mask allows the thin gate oxide areas to be minimized to improve reliability over the same anti-fuse cell manufactured with a standard low grade OD2 mask.

For the embodiment of FIG. 5a, more accurate overlap of the OD2 shape end/edge underneath the polysilicon gate 106 allows for a minimized thin oxide area under the polysilicon gate. In particular, the thin oxide area will be rectangular in shape, having two opposite sides defined by the width of the active area underneath the polysilicon gate, and another two opposite sides defined by the OD2 mask shape end underneath the polysilicon gate and an edge of the polysilicon gate. The addition of high precision alignment will further minimize the thin oxide area.

For example, an improvement in alignment from +/−0.1 microns to +/−0.06 microns for a 0.20 micron thin oxide area dimension, will allow for a 0.04 micron smaller thin oxide dimension, thereby reducing the dimension to 0.16 microns. This alone will improve the yield and reliability of the anti-fuse memory cell since both yield and reliability depend directly upon the total thin gate oxide area. Yield and reliability improvements are seen even when alignment is improved to +/−0.08 microns for 90 nm and 65 nm processes. The high grade OD2 mask can be used in the process described in FIG. 6 for fabricating the thin and thick gate oxide areas of the anti-fuse transistor.

The presently described embodiments of the invention describe anti-fuse transistors having thin and thick gate oxides. Those skilled in the art will understand that advanced semiconductor manufacturing technologies can use different dielectric materials for forming the thin gate oxide areas, in addition to or instead of oxide. Those skilled in the art will understand that the mask for depositing or growing the dielectric can have shaped openings positioned to overlap the active area, in the same manner as previously described for the OD2 mask used to define the thin gate oxide area of the anti-fuse transistor.

Those skilled in the art will understand that the OD2 mask with openings to define thin gate oxide areas can be an assembly of smaller unit sub-mask shapes tiled together in a repeating pattern, each having a full opening defined therein, or a portion of an opening defined therein such that the mating of adjacent tiles will result in an enclosed opening.

The above-described embodiments of the present invention are intended to be examples only. Alterations, modifications and variations may be effected to the particular embodi-

What is claimed is:

1. A non-volatile memory cell formed on a substrate with a CMOS fabrication process capable of forming structures with a predefined minimum feature size i, where i is a numerical value in nm, comprising:
   a polysilicon gate over a channel region having a channel length and a channel width;
   a diffusion region proximate to a first end of the channel region;
   a field oxide region proximate to a second end of the channel region;
   a variable thickness gate oxide between the polysilicon gate and the substrate, the variable thickness gate oxide having a thick gate oxide portion and a thin gate oxide portion fusible to form a conductive link between the polysilicon gate and the substrate, the thin gate oxide portion being formed over the channel region and having dimensions less than the minimum feature size i.

2. The non-volatile memory cell of claim 1, wherein the thin gate oxide portion is rectangular in shape.

3. The non-volatile memory cell of claim 2, wherein a first side and a second side of the rectangle are bound by the thick gate oxide portion and a third side and a fourth side of the rectangle are bound by the channel region.

4. The non-volatile memory cell of claim 1, wherein the thin gate oxide portion is triangular in shape.

5. The non-volatile memory cell of claim 4, wherein a first side and a second side of the triangle are bound by the channel region and a diagonal side of the triangle is bound by the thick gate oxide portion.

* * * * *